United States Patent
Martinez Ramirez et al.

(10) Patent No.: US 11,900,902 B2
(45) Date of Patent: Feb. 13, 2024

(54) DEEP ENCODER FOR PERFORMING AUDIO PROCESSING

(71) Applicant: Adobe Inc., San Jose, CA (US)

(72) Inventors: Marco Antonio Martinez Ramirez, London (GB); Nicholas J. Bryan, Belmont, CA (US); Oliver Wang, Seattle, WA (US); Paris Smaragdis, Urbana, IL (US)

(73) Assignee: Adobe Inc., San Jose, CA (US)

( * ) Notice: Subject to any disclaimer, the term of this patent is extended or adjusted under 35 U.S.C. 154(b) by 323 days.

(21) Appl. No.: 17/228,357

(22) Filed: Apr. 12, 2021

(65) Prior Publication Data

US 2022/0328025 A1    Oct. 13, 2022

(51) Int. Cl.
*G10H 1/00*    (2006.01)
*H04R 5/04*    (2006.01)
(Continued)

(52) U.S. Cl.
CPC .......... *G10H 1/0008* (2013.01); *G06N 3/084* (2013.01); *H03G 3/32* (2013.01); *H03G 5/025* (2013.01);
(Continued)

(58) Field of Classification Search
CPC ...... G10H 1/0008; G10H 1/0091; G10H 1/12; G10H 2250/165; G10H 2210/311; G10H 2210/315; G10H 2250/311; G06N 3/04; G06N 3/084; H03G 3/32; H03G 5/025; H03G 5/165; H03G 7/007; H04R 5/04; H04S 3/008; G10L 19/00; G10L 19/24;
(Continued)

(56) References Cited

U.S. PATENT DOCUMENTS 10,147,433 B1 * 12/2018 Bradley ................ G10L 19/018
10,236,031 B1 *  3/2019 Gurijala ............... G10L 19/018
(Continued)

OTHER PUBLICATIONS

Damskägg, E-P et al., "Deep Learning for Tube Amplifier Emulation," arXiv:1811.00334v2 [eess.AS], Feb. 20, 2019, 6 pages.
(Continued)

*Primary Examiner* — Yogeshkumar Patel
(74) *Attorney, Agent, or Firm* — Nicholson De Vos Webster & Elliott LLP

(57) ABSTRACT

Embodiments are disclosed for determining an answer to a query associated with a graphical representation of data. In particular, in one or more embodiments, the disclosed systems and methods comprise receiving an input including an unprocessed audio sequence and a request to perform an audio signal processing effect on the unprocessed audio sequence. The one or more embodiments further include analyzing, by a deep encoder, the unprocessed audio sequence to determine parameters for processing the unprocessed audio sequence. The one or more embodiments further include sending the unprocessed audio sequence and the parameters to one or more audio signal processing effects plugins to perform the requested audio signal processing effect using the parameters and outputting a processed audio sequence after processing of the unprocessed audio sequence using the parameters of the one or more audio signal processing effects plugins.

20 Claims, 10 Drawing Sheets

(51) Int. Cl.
*G06N 3/084* (2023.01)
*H03G 5/02* (2006.01)
*H03G 3/32* (2006.01)

(52) U.S. Cl.
CPC ......... *H04R 5/04* (2013.01); *G10H 2250/165* (2013.01)

(58) Field of Classification Search
CPC ......... G10L 25/30; G10L 25/03; G10L 25/18; G10L 25/24; G06F 3/16
See application file for complete search history.

(56) References Cited

U.S. PATENT DOCUMENTS

| | | | | |
|---|---|---|---|---|
| 10,453,434 | B1* | 10/2019 | Byrd | G10L 25/18 |
| 10,515,626 | B2* | 12/2019 | Li | G10L 15/16 |
| 2021/0012189 | A1* | 1/2021 | Wang | G06V 10/764 |
| 2021/0082444 | A1* | 3/2021 | Fejgin | G10L 19/022 |
| 2021/0327445 | A1* | 10/2021 | Biswas | G10L 21/0364 |

OTHER PUBLICATIONS

Dumpala, S.H. et al., "An Algorithm for Detection of Breath Sounds in Spontaneous Speech with Application to Speaker Recognition," International Conference on Speech and Computer, SPECOM 2017: Speech and Computer, Aug. 2017, pp. 98-108.

Eichas, F. et al., "Black-box modeling of distortion circuits with block-oriented models," Proceedings of the 19th International Conference on Digital Audio Effects (DAFx-16), Sep. 5-9, 2016, pp. DAFX'-1-DAFX'-7.

Hawley, S. H. et al., "SignalTrain: Profiling Audio Compressors with Deep Neural Networks," arXiv:1905.11928 [eess.AS], May 30, 2019, 9 pages.

LANDR: Creative Tools for Musicians, https://www.landr.com, retrieved on Feb. 5, 2023, 5 pages.

Martinez Ramirez, M. A. et al., "Modeling of non-linear audio effects with end-to-end deep neural networks," arXiv:1810.06603 [eess.AS], Mar. 6, 2019, 5 pages.

Martinez Ramirez, M.A. et al., "Deep Learning for Black-Box Modeling of Audio Effects," Applied Sciences 10, No. 2: 638, Jan. 16, 2020, 25 pages.

Mimilakis, S.-I. et al., "Automated Tonal Balance Enhancement for Audio Mastering Applications," AES Convention Paper 8836, May 2013, 7 pages.

Mimilakis, S.-I. et al., "Deep Neural Networks for Dynamic Range Compression in Mastering Applications," AES Convention Paper 9539, May 2016, 7 pages.

Moffat, D. et al., "Approaches in Intelligent Music Production," Arts 8, No. 4: 125, Sep. 25, 2019, 14 pages.

Spall, J.C., "An Overview of the Simultaneous Perturbation Method for Efficient Optimization," John Hopkins APL Technical Digest, vol. 19, No. 4, 1998, pp. 482-492.

Spall, J.C., "Multivariate Stochastic Approximation Using a Simultaneous Perturbation Gradient Approximation," IEEE Transactions on Automatic Control, vol. 37, No. 3, Mar. 1992, pp. 332-341.

Terrell, M. et al., "Automatic Noise Gate Settings for Drum Recordings Containing Bleed from Secondary Sources," EURASIP J. Adv. Signal Process, vol. 2010, Article 465417, Feb. 2011, 9 pages.

Waves Audio, Vocal Rider Plugin, retrieved via Internet: https://www.waves.com/plugins/vocal-rider#how-to-level-vocals-perfectly-in-3-clicks, accessed on Sep. 23, 2022, 5 pages.

Wright, A. et al., "Real-Time Guitar Amplifier Emulation with Deep Learning," Applied Sciences 10, No. 3: 766, Jan. 21, 2020, 18 pages.

Yeh, D.T. et al., "Numerical Methods for Simulation of Guitar Distortion Circuits," Computer Music Journal, vol. 32(2), Jun. 2008, pp. 23-42.

\* cited by examiner

DEEP ENCODER FOR PERFORMING AUDIO PROCESSING

BACKGROUND

Sound waves can be electronically represented as audio signals, which can be electronically manipulated through audio signal processing. For example, audio signal processing effects, or audio effects, can be used to manipulate different sound characteristics such as loudness, dynamics, frequency, and timbre across a variety of media. However, many audio signal processing effects can be difficult to use or are simply not powerful enough to achieve a desired effect.

Existing solutions to address this include audio effects circuit modeling, analytical methods, and intelligent audio effects that dynamically change their parameter settings by exploiting sound engineering best practices. The most common approach for the latter is adaptive audio effects or signal processing systems based on the modeling and automation of traditional processors. More recent deep learning methods for audio effects modeling and intelligent audio effects include: end-to-end direct transformation methods, where a neural proxy learns and applies the transformation of an audio effect target; parameter estimators, where a deep neural network predicts the parameter settings of an audio effect; and differentiable digital signal processing, where signal processing structures are implemented within a deep learning auto-differentiation framework and trained via backpropagation.

However, these existing solutions are limited in several ways. First, direct transform approaches can require special, custom modeling strategies per effect (e.g., distortion), are often based on large and expensive networks, and/or use models with limited or no editable parameter control. Second, parameter estimator methods commonly require expensive human-labeled data for learning. They are typically also optimized to minimize parameter prediction error and not audio quality directly, which can lead to reduced performance. Third, typical differentiable digital signal processing approaches require a differentiable implementation for learning with backpropagation, re-implementation of each audio effect, and in-depth knowledge to do so, limiting use to known differentiable effects and causing high engineering effort.

These and other problems exist with regard to systems that perform audio signal processing.

SUMMARY

Introduced here are techniques/technologies that use machine learning to control audio effects. For example, in some embodiments, a deep encoder receives unprocessed audio and an audio processing effect to perform on the unprocessed audio. The deep encoder analyzes the unprocessed input audio and an output parameter estimator layer estimates the parameters of one or more black-box audio signal processing effects plugins that perform signal manipulation of the unprocessed input audio to achieve the desired audio processing effect. The unprocessed audio input and the set of one or more parameter values are provided to an audio effects module including the one or more audio signal processing effects plugins that execute the processing of the audio input, resulting in the output of a processed audio output.

Additionally, the deep encoder is trained using a loss function. This loss function is based on a comparison of the unprocessed audio input, the processed audio output, and a target, or ground truth, audio. The loss function enables the deep encoder to learn to estimate parameters for the one or more black-box audio signal processing effects plugins.

Additional features and advantages of exemplary embodiments of the present disclosure will be set forth in the description which follows, and in part will be obvious from the description, or may be learned by the practice of such exemplary embodiments.

BRIEF DESCRIPTION OF THE DRAWINGS

The detailed description is described with reference to the accompanying drawings in which.

DETAILED DESCRIPTION

One or more embodiments of the present disclosure include an audio signal processing system that uses machine learning to perform audio signal processing. In particular, one or more embodiments include optimizations to audio signal processing by incorporating stateful third-party audio effects as layers within a deep neural network, and do not require the use of neural proxies, re-implementation of audio effects plugins, or expensive human-labeled data.

To address these issues, the audio signal processing system trains and deploys a deep encoder to generate audio effects parameters that are used by one or more audio signal processing effects plugins to produce a processed audio output. In particular, in one or more embodiments, the audio signal processing system receives unprocessed audio as an input and uses deep encoder to determine parameters associated with one or more audio signal processing effects plugins. The parameters and the unprocessed audio are used by one or more audio signal processing effects plugins to process the unprocessed audio.

Embodiments address these and other deficiencies of prior techniques through a number of optimizations. For example, the audio signal processing system is a deep learning architecture that trains a deep encoder to analyze unprocessed audio input and learn to estimate parameters for audio effect black-boxes that perform an audio signal processing of the unprocessed audio input. Additionally, the audio signal processing system uses an end-to-end backpropagation method that allows differentiation through non-differentiable black-box audio effects layers via a fast, parallel stochastic gradient approximation scheme used within a standard auto differentiation graph. The audio signal processing system also implements a training scheme that can support stateful black-box processors. Further, the audio signal processing system utilizes a delay-invariant loss function to mitigate the effects of group delay.

Embodiments described herein can be used to transform unprocessed, raw audio, including speech recordings, into processed or produced sounding recordings. For example, the audio signal processing system can receive unprocessed, raw audio that includes both speech sounds and non-speech vocal sounds (e.g., clicks, lip smacks, breathing, noise, reverberations, etc.) and, through the application of the unprocessed, raw audio through the deep encoder to generate parameters for one or more audio signal processing effects plugins, transforms the unprocessed, raw audio into a produced audio recording.

Figure 1:
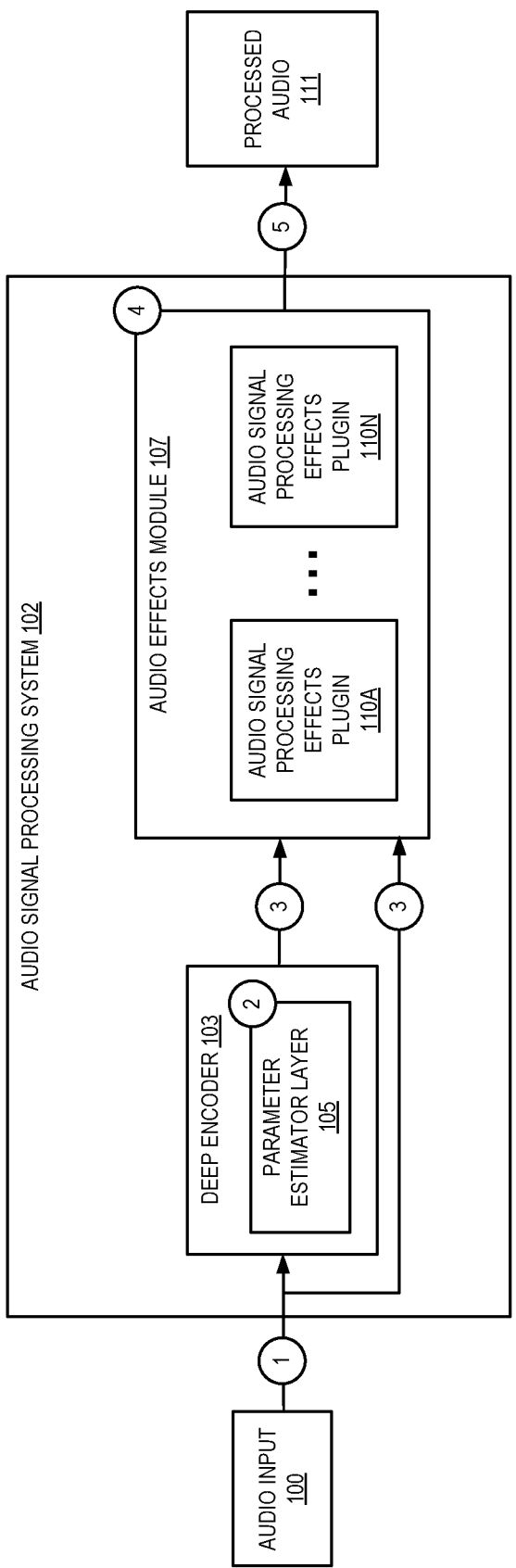
FIG. 1 illustrates a diagram of a process of performing audio processing effects on an audio sequence through audio signal processing effects plugins using parameters estimated by a deep encoder in accordance with one or more embodiments.

FIG. 1 illustrates a diagram of a process of performing audio processing effects on an audio sequence through audio signal processing effects plugins using parameters estimated by a deep encoder in accordance with one or more embodiments. As shown in FIG. 1, in one or more embodiments, an audio signal processing system 102 receives an audio input 100, as shown at numeral 1. For example, the audio signal processing system 102 receives the audio input 100 from a user via a computing device. In one or more embodiments, the audio input 100 includes both unprocessed audio and a selection of an audio signal processing effect to be performed on the unprocessed audio. In one example, a user may select an audio file including unprocessed audio in an application and be presented with an interface through which the user may input or select a type of audio signal processing effect (e.g., tube amplifier emulation, automatic non-speech sounds removal, automatic music mastering, etc.). In another example, a user may submit an audio file to a web service, or an application configured to receive audio files as inputs and provide a processed audio file as outputs.

In one or more embodiments, the audio signal processing system 102 includes a deep encoder 103 that receives the audio input 100. In one or more embodiments, the deep encoder 103 is a neural network that includes deep learning architecture for learning representations of audio. A neural network may include a machine-learning model that can be tuned (e.g., trained) based on training input to approximate unknown functions. In particular, a neural network can include a model of interconnected digital neurons that communicate and learn to approximate complex functions and generate outputs based on a plurality of inputs provided to the model. For instance, the neural network includes one or more machine learning algorithms. In other words, a neural network is an algorithm that implements deep learning techniques, i.e., machine learning that utilizes a set of algorithms to attempt to model high-level abstractions in data.

In one or more embodiments, to allow the deep encoder 103 to learn long temporal dependencies, the input, $\bar{x}$, includes the current audio frame x centered within a larger audio frame including previous and subsequent context samples. In one or more embodiments, the input to the deep encoder 103 includes a log-scaled mel-spectrogram non-trainable layer followed by a batch normalization layer. In such embodiments, the last layer of the deep encoder 103, parameter estimator layer 105, is a dense layer with P units and sigmoid activation, where P is the total number of parameters. In one or more embodiments, the output is the estimated parameters, $\hat{\theta}$, for the current input frame x.

The parameter estimator layer 105 generates one or more parameters for one or more audio signal processing effects plugins based on the audio input 100, as shown at numeral 2. In one or more embodiments, the parameter estimator layer 105 includes functions used to estimate the parameters to be used by the audio effects module 107. After a training phase, described herein with respect to FIG. 2, the deep encoder 103 includes a trained encoder with a parameter estimator layer (e.g., parameter estimator layer 105) which can be used to estimate the parameter values for each parameter associated with one or more audio signal processing effects plugins (e.g., audio signal processing effects plugins 110A-N) when an unprocessed audio input and selected audio processing effect are received. The parameters may include any parameters used for audio signal processing including, for example, threshold, makeup gain, ratio, frequency splits, input and output gains, etc. The parameter estimator layer 125 may receive the audio input 100 and the selected type of audio signal processing effect to generate the parameter values to be used by one or more audio signal processing effects plugins 110A-110N to generate processed audio as an output. For example, for a tube amplifier emulation audio effect, the parameter values may be those estimated to apply by one of more audio signal processing effects plugins 110A-110N to the audio input 100 to generate a processed audio output. In one or more embodiments, the parameter estimator layer 105 determines parameters for one of more audio signal processing effects plugins 110A-110N, where the one of more audio signal processing effects plugins 110A-110N are determined based on the selected audio processing effect.

In one or more embodiments, each parameter may be associated with an output node of the parameter estimator layer 105. Weights associated with each output node may determine the parameter values used by one or more audio signal processing effects plugins 110A-110N. For example, as the deep encoder 103 is trained, the weights associated with each output node may be adjusted to better ensure the parameter values applied to the audio input 100 results in the processed audio 111.

In one or more embodiments, the parameters generated by the parameter estimator layer 105 and the audio input 100 are sent to the audio effects module 107, as shown at numeral 3. The audio effects module 107 includes one or more black-box functions. Each of the one or more black-box functions may be a function, including a legacy function, a new function, a function from an application that performs corresponding functionality, and the like. The black-box function may be written in any suitable programming language including, for example, C++. The developer of the deep encoder 103 will know at least the inputs needed for each of the one or more black-box functions and what are the outputs from the one or more black-box functions. In one or more embodiments, each of the one or more black-box functions is wrapped in a code layer of a neural network. For example, in FIG. 1, audio effects module 107 may be wrapped in a code layer of a neural network and/or each of the one or more audio signal processing effects plugins (e.g., black-box functions) are wrapped in one or more code layers of a neural network. For example, deep encoder 103 and the audio effects module 107 (and/or the individual audio signal processing effects plugins 110A-110N) may comprise layers of a neural network. The audio effects module 107 may receive, as input, the inputs necessary to execute each of the one or more black-box functions. The one or more black-box functions (e.g., the audio signal processing effects plugins) are then executed based on the inputs to generate the output.

The specific examples used herein for the one or more black-box functions of the audio effects module 107 include a multiband dynamic range compressor, a multiband noise gate, a graphic equalizer, and a mono limiter. In other examples, the one or more black-box functions of the audio effects module 107 can include additional, fewer, and/or different black-box functions. Each of the audio processing effect can be associated with one or more black-box functions. As described herein, the black-box functions of the audio effects module 107 receive unprocessed audio and parameter values as inputs. In one or more embodiments, the audio effects module 107 retrieves the parameters and/or the audio input 100 from the deep encoder 103 or from a memory or storage location, and outputs processed audio 111.

In one or more embodiments, the audio effects module 107 is a stateful black-box that includes one or more connected audio signal processing effects plugins 110A-110N, or audio effects. The one or more audio signal processing effects plugins 110A-110N perform audio effects on the received input audio 100 based on the parameters for the one or more audio signal processing effects plugins 110A-110N generated by the parameter estimator layer 105, as shown at numeral 4. In one or more embodiments, the one or more audio signal processing effects plugins 110A-110N uses the input audio, x, and parameters, θ, to produce an output waveform, that can be represented as:

$$y = f(x, \hat{\theta})$$

In one or more embodiments, the audio signal processing system 102 can output the processed audio 111 generated by the one or more audio signal processing effects plugins 110A-110N, as shown at numeral 5. In one or more embodiment, the processed audio 111 is sent to the user or computing device that initiated the request or provided the audio input 100 at numeral 1.

Figure 2:
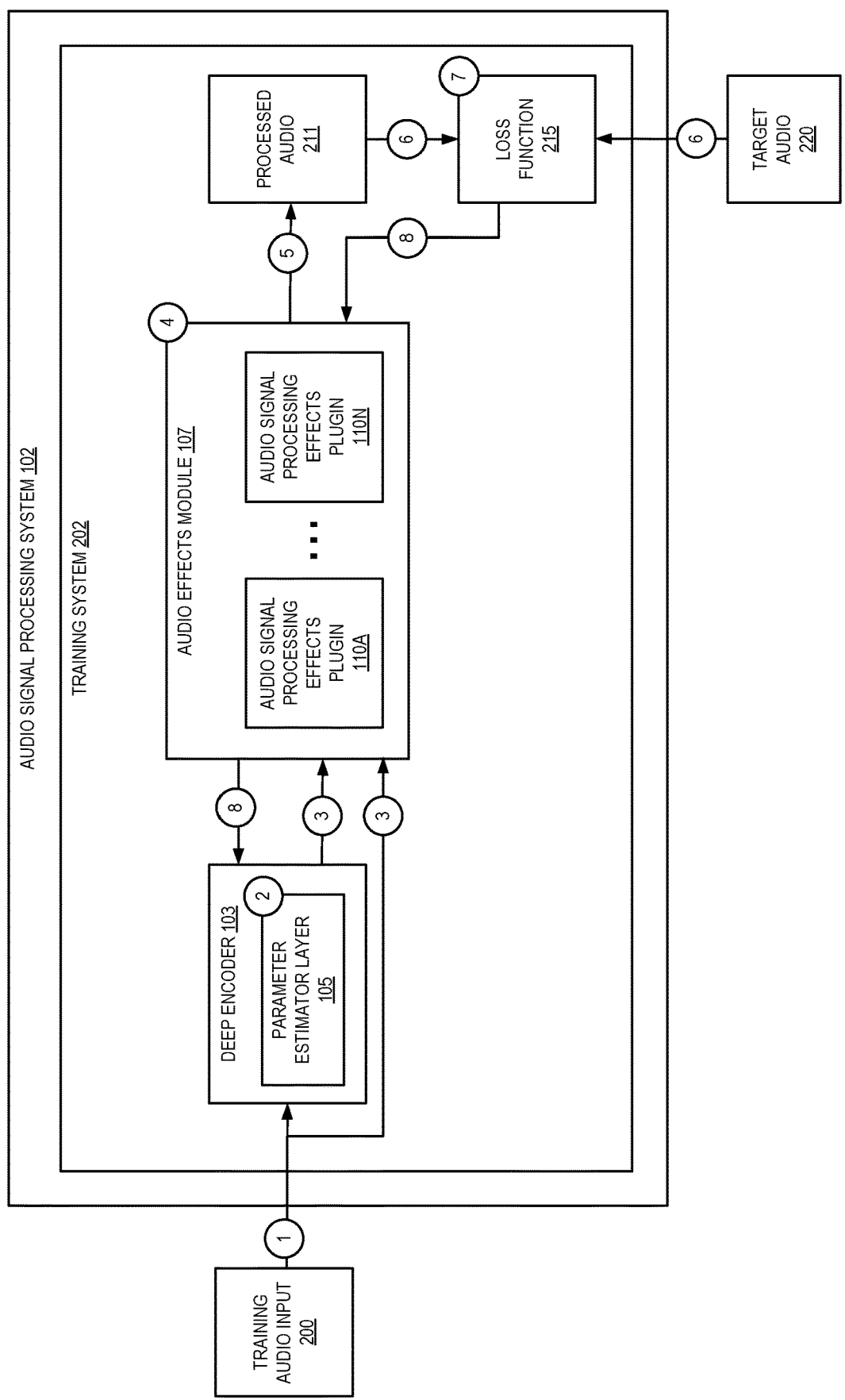
FIG. 2 illustrates a diagram of a training system for training a machine learning model to determine gradient using a loss function in accordance with one or more embodiments.

FIG. 2 illustrates a diagram of a training system for training a machine learning model to determine gradients using a loss function in accordance with one or more embodiments. Embodiments use a loss function during training which forces the parameter estimator layer 105 of the deep encoder 103 to learn to estimate parameters for one of more audio signal processing effects plugins 110A-110N.

As shown in FIG. 2, training proceeds similarly to the inference process described above with respect to FIG. 1. The training system 202 receives a training audio input 200, as shown at numeral 1. For example, the audio signal processing system 102 receives the training audio input 200 from a user via a computing device or from a memory or storage location. Although depicted as part of audio signal processing system 102, in various embodiments, training system 202 may be implemented as a separate system implemented on electronic devices separate from the electronic devices implementing audio signal processing system 102. In one or more embodiments, the training audio input 200 includes both unprocessed audio and a selection of an audio signal processing effect to be performed on the unprocessed audio. The training audio input 200 can include multiple audio files that can be fed to the audio signal processing system 102 in parallel or in series.

In one or more embodiments, the audio signal processing system 102 includes a deep encoder 103 that receives the training audio input 200. The deep encoder 103 includes a parameter estimator layer 105 that generates one or more parameters for one or more audio signal processing effects plugins based on the training audio input 200, as shown at numeral 2. In one or more embodiments, the parameter estimator layer 105 includes functions used to estimate the parameters to be used by the audio effects module 107. The parameters may include any parameters used for audio signal processing including, for example, threshold, makeup gain, ratio, frequency splits, input gain, output gain, etc. The parameter estimator layer 125 may receive the training audio input 200 and the selected type of audio signal processing effect to generate the parameter values to be used by one or more audio signal processing effects plugins 110A-110N to generate processed audio as an output.

In one or more embodiments, each parameter may be associated with an output node of the parameter estimator layer 105. In one or more embodiments, weights associated with each output node may determine the parameter values used by one or more audio signal processing effects plugins 110A-110N. For example, as the deep encoder 103 is trained, the weights associated with each output node may be adjusted to better ensure the parameter values applied to the training audio input 200 results in the processed audio 211.

In one or more embodiments, the parameters generated by the parameter estimator layer 105 and the training audio input 200 are sent to the audio effects module 107, as shown at numeral 3. In one or more other embodiments, the audio effects module 107 retrieves the parameters and/or the training audio input 200 from a memory or storage location. In one or more embodiments, the audio effects module 107 is a stateful black-box that includes one or more connected audio signal processing effects plugins 110A-110N, or audio effects.

In one or more embodiments, one or more audio signal processing effects plugins 110A-110N perform audio effects on the received training audio input 200 based on the parameters generated by the parameter estimator layer 105, as shown at numeral 4. In one or more embodiments, the audio signal processing system 102 can output the processed audio 211 generated by the one or more audio signal processing effects plugins 110A-110N, as shown at numeral 5.

In one or more embodiments, a loss function 215 receives the processed audio 211 and a target audio 220, as shown at numeral 6. The target audio 220 can be analog audio that has been converted to a digital format, audio mastered by a sound engineer, etc. The target audio 220 can be retrieved from a memory or storage location.

In one or more embodiments, the loss function 215 and a gradient (approximation) method is used to calculate the gradients of the processed audio 211 with respect to the audio signal processing effects plugins parameters and, in some embodiments, the input signal, as shown at numeral 7.

In some embodiments, the computed gradients from the audio signal processing effects plugins 110A-110N are then used to update the deep encoder 103 using standard automatic differentiation.

In one or more embodiments, to approximate the gradients, a stochastic gradient approximation method called simultaneous permutation stochastic approximation (SPSA) is used. In some embodiments, only the gradients of the parameters $\hat{\theta}$ are approximated. In other embodiments, both the gradients of the parameters $\hat{\theta}$ and gradients of the signal are approximated.

In one or more embodiments, the SPSA gradient estimator, $\tilde{\nabla}^{SPSA}$, is based on the random perturbation of all of the parameters $\hat{\theta}$ at the same time. The ith element of $\tilde{\nabla}^{SPSA}$ may be represented by:

$$\tilde{\nabla}^{SPSA} f(\hat{\theta}_0)_i = \frac{f(\hat{\theta}_0 - \in \hat{\Delta}^P)_i - f(\hat{\theta}_0 - \in \hat{\Delta}^P)}{2 \in \Delta_i^P},$$

where $\hat{\Delta}^P$ is a P-dimensional random perturbation vector sampled from a symmetric Bernoulli distribution, i.e., $\Delta_i^P = \pm 1$ with a probability of 0.5. In one or more embodiments, in each iteration, the total number of functions $f(\ )$ is two, because the numerator in the above equation is identical for all the elements of $\tilde{\nabla}^{SPSA}$.

The gradients are backpropagated through the audio signal processing effects plugins 110A-110N of the audio effect module 107 to the deep encoder 103, as shown at numeral 8. For example, SPSA is used with backpropagation to flow the gradients through the black-box audio signal processing effects plugins 110A-110N of the audio effects module 107. Once the gradients have passed through the audio effects module 107, backpropagation can be used to update encoder weights of the deep encoder 103. For example, the gradients are used to adjust the weights associated with output nodes of the parameter estimator layer 105.

In one or more embodiments, a delay-invariant loss function is used to train the deep encoder 103 to control (e.g., generate parameters) for audio effects. Multiband audio effects correspond to audio processors that split the input signal into various frequency bands via different types of filters. In one or more embodiments, when training a neural network to control an audio effect, the audio effect itself can introduce small phase and group delay differences (e.g., a frequency-dependent time delay of the sinusoidal components of the input). These and other similar types of effects can also apply a 180° phase shift (e.g., to invert the sign of the input). While these small differences may not cause an audible difference in the sound quality, they can, however, cause a significant increase in the optimization loss (e.g., in the mean squared error sense) when compared to paired ground truth audio. This can result in difficulties when directly applying a loss function with inexact inputs, either in the time or frequency domain. In one or more embodiments, to mitigate these issues, a delay-invariant loss function is used. The delay-invariant loss function can find the best matching time point between the processed audio output across a small-time window and then optimize the loss, reducing the effect of this problem.

In one or more embodiments, the loss function 215 determines the delay-invariant loss by determining a number of audio frames representing a delay between the target audio 220 (or ground truth audio) and the processed audio 211 (or training audio output). After removing the number of audio frames representing the delay, the target audio 220 and the processed audio 211 are aligned. A polarity is then calculated, and a first loss value is calculated with a non-inverted polarity and a second loss value is calculated with an inverted polarity. In one or more embodiments, the minimum of the first loss value and the second loss value is selected as the loss value.

A time delay, $\tau$, between the target audio 220, $\bar{y}$, and the processed audio 211 y audio frames via cross-correlation (*) can be represented by, $$\tau = \mathrm{argmax}(\bar{y} * y).$$

In one or more embodiments, the loss in the time domain, $$L_{time} = \min(\|\bar{y}_\tau - y_\tau\|_1, \|\bar{y}_\tau + y_\tau\|_1)$$

corresponds to the minimum L1 distance between the time-aligned target audio 220, $\bar{y}_\tau$, and both a 0° phase shift and 1800 phase shift time-aligned processed audio 211 $y_\tau$. In one or more embodiments, $\bar{Y}_\tau$ and $Y_\tau$, a 1024-point Fast Fourier Transform (FFT) magnitude of $\bar{y}_\tau$ and $y_\tau$, respectively, are computed. The loss in the frequency domain $L_{freq}$ can then be defined as:

$$L_{freq} = \|\bar{Y}_\tau - Y_\tau\|_2 + \|\log \bar{Y}_\tau - \log Y_\tau\|_2$$

In one or more embodiments, the final loss function can then be defined as:

$$L = \propto_1 L_{time} + \propto_2 L_{freq}$$

In one or more embodiments, the values of $\alpha_1$ and $\alpha_2$ can be empirically tuned to be 10 and 1, respectively.

Figure 3:
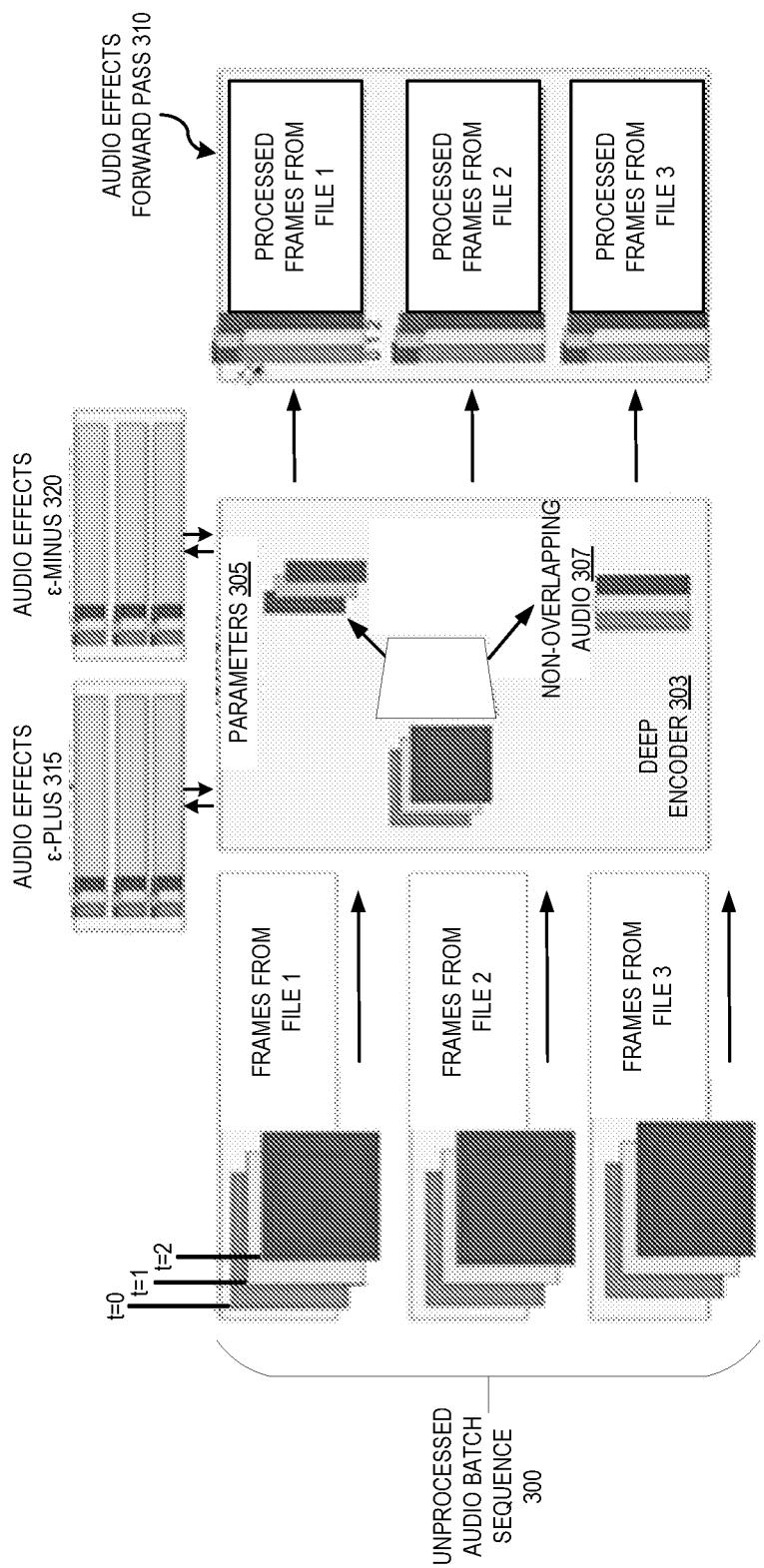
FIG. 3 illustrates an example process of training a deep encoder to estimate parameters for audio signal processing effects plugins in accordance with one or more embodiments.

FIG. 3 illustrates an example process of training a deep encoder to estimate parameters for audio signal processing effects plugins in accordance with one or more embodiments. In one or more embodiments, the audio input is a batch of multiple audio files. As illustrated in FIG. 3, unprocessed audio batch sequence 300 is a batch of three audio files. The unprocessed audio batch sequence 300 is fed to the deep encoder 303 one frame at a time. For example, at time t=0, a first frame from each of files 1-3 is fed to the deep encoder 303, at time t=1, a second frame from each of files 1-3 is fed to the deep encoder 303, etc. As illustrated in FIG. 3, the output of the deep encoder 303 includes parameters 305 for one or more audio signal processing effects plugins and non-overlapping audio 307. In one or more embodiments, each frame of the non-overlapping audio 307 outputted from the deep encoder 303 is shorter than the corresponding frame that was received and analyzed by the deep encoder 303. For example, a large analysis frame size provided as input to the deep encoder 303 can be 1.85 seconds, while a smaller processing frame size of the non-overlapping audio 307, taken as the center of the larger analysis frame/window can be 46 milliseconds. In one or more embodiments, the shorter frames of the non-overlapping audio 307 are used for the loss function, resulting in computational savings. This computation savings can be realized because the smaller processing frame size of the non-overlapping audio 307 is processed instead of the whole larger analysis frame versus alternatives that input the entire analysis frame into the audio effects for processing.

In one or more embodiments, because audio effects are stateful systems where the output depends on previous input samples or internal states, the audio effects module 107 is fed consecutive non-overlapping audio frames (e.g., non-overlapping audio 307) of size N (e.g., audio frames with a hop size of N samples, where the internal block size of each audio signal processing effects plugin is set to a divisor of N). Feeding the deep encoder 303 consecutive non-overlapping audio frame, as opposed to random sampling, ensures that there are no discrepancies between the behavior of the audio effects during training and inference time.

In one or more embodiments, a separate audio effects processor is used for each file/item in the unprocessed audio batch sequence 300. For example, for a batch size of M, M independent audio effects for the forward pass of backpropagation are instantiated. Continuing the example of FIG. 3, an audio effects instance is instantiated for each of the three files including a portion of audio. Each instance in the audio effects forward pass 310 processes the received non-overlapping audio 307 using the corresponding parameters 305, resulting in the output of processed audio. In one or more embodiments, the processing by the multiple instances of the audio effects in the audio effects forward pass 310 are performed in parallel. In one or more embodiments, this processing is performed using a single GPU, multi-threaded CPU framework. In one or more other embodiments, multiple GPUs can be used to perform this processing.

In one or more embodiments, in order to approximate the gradients, an additional two independent audio effects are instantiated for each file/item in the unprocessed audio batch sequence 300. One of the additional audio effects instances is for a forward pass and the other additional audio effects instance is for a backward pass. In one or more embodiments, when optimizing a neural network to control black-box code, the state of the black-boxes must be maintained during the forward and backward pass of auto-differentiation for optimization. In such embodiments, this results in 3M audio effects instances when optimizing with SPSA gradients. In contrast, optimizations using a finite difference (FD) scheme require $(2P+1) \times M$ audio effect instances, which can become unmanageable when there are a large number of parameters, P, and/or a large batch size M.

For example, a comparison of the training of the computation times of gradient approximation using a FD scheme and a SPSA scheme provided the following results for 1 epoch (1000 steps with a batch size of 100), as shown in Table 1, below.

TABLE 1

Experimental Performance Comparison

| | Number of Parameters | | |
|---|---|---|---|
| | 1 Parameter | 10 Parameters | 100 Parameters |
| FD + normal rendering | ~10.5 minutes | ~48 minutes | ~7.8 hours |
| SPSA + Parallel + Sequential Rendering | ~3 minutes | ~3 minutes | ~3 minutes |

As shown in the example of FIG. 3, for the three files in the unprocessed audio batch sequence 300, three audio effects instances are instantiated for the audio effects forward pass 310 during backpropagation, three audio effects instances are instantiated for the audio effect E-plus 315, and three audio effects instances are instantiated for the audio effect E-minus 320. In one or more embodiments, the audio effect E-plus 315 instances and the audio effect E-minus 320 instances are used for generating the gradients of the parameters during backpropagation. The same audio processing frame is pumped into all three audio effects instances within a forward/backward pass so the internal states of each instance match. After being used to for gradient approximation, the outputs of the audio effect E-plus 315 instances and the audio effect E-minus 320 instances can be discarded. In one or more embodiments, mirroring the three copies of the audio effects by providing them with the same audio processing frames allows them to maintain the same internal state resulting in more accurate gradient approximations.

In one or more embodiments, because of the speed and memory improvements, the audio signal processing system is capable of computing signal gradient estimates in addition to parameter gradient estimates. In some embodiments, the FD and stochastic gradient approximation subcomponent are used to estimate only the gradients of the loss with respect to the black-box audio effects parameter inputs and not the signal gradients. In such embodiments, this requires the black-box audio effects to be at the end of the neural network architecture. If the black-box audio effects are placed anywhere else, signal gradients will likely be needed. In an example, for a one second audio sample at a 16 kHz sampling rate, the signal gradient computation for a single batch element would take 32,000 (2×16,000) forward passes through a black-box audio effect. If the black-box audio effect is stateful, this would also require maintaining 32,000 different copies of the black-box audio effects. In contrast, the audio signal processing system described herein uses two forward computation passes and two copies of the black-box audio effect.

As noted above, in one or more embodiments, the audio signal processing system is capable of computing signal gradient estimates. In such embodiments, the audio signal processing system can include an additional deep network module configured to pre-process the input audio signal before it is sent to the audio effects module for processing by the one or more audio signal processing effects plugins. The weights of the additional deep network module can be updated by computing the signal gradient through the audio signal processing effects plugins and using the computed signal gradients with the backpropagation gradients.

In one or more embodiments, example audio processing effects that can be performed using the audio signal processing system include tube amplifier emulation, automatic non-speech sounds removal, and automatic music mastering. Each type of audio processing effect can involve the use of one or more different audio signal processing effects plugin.

Figure 4:
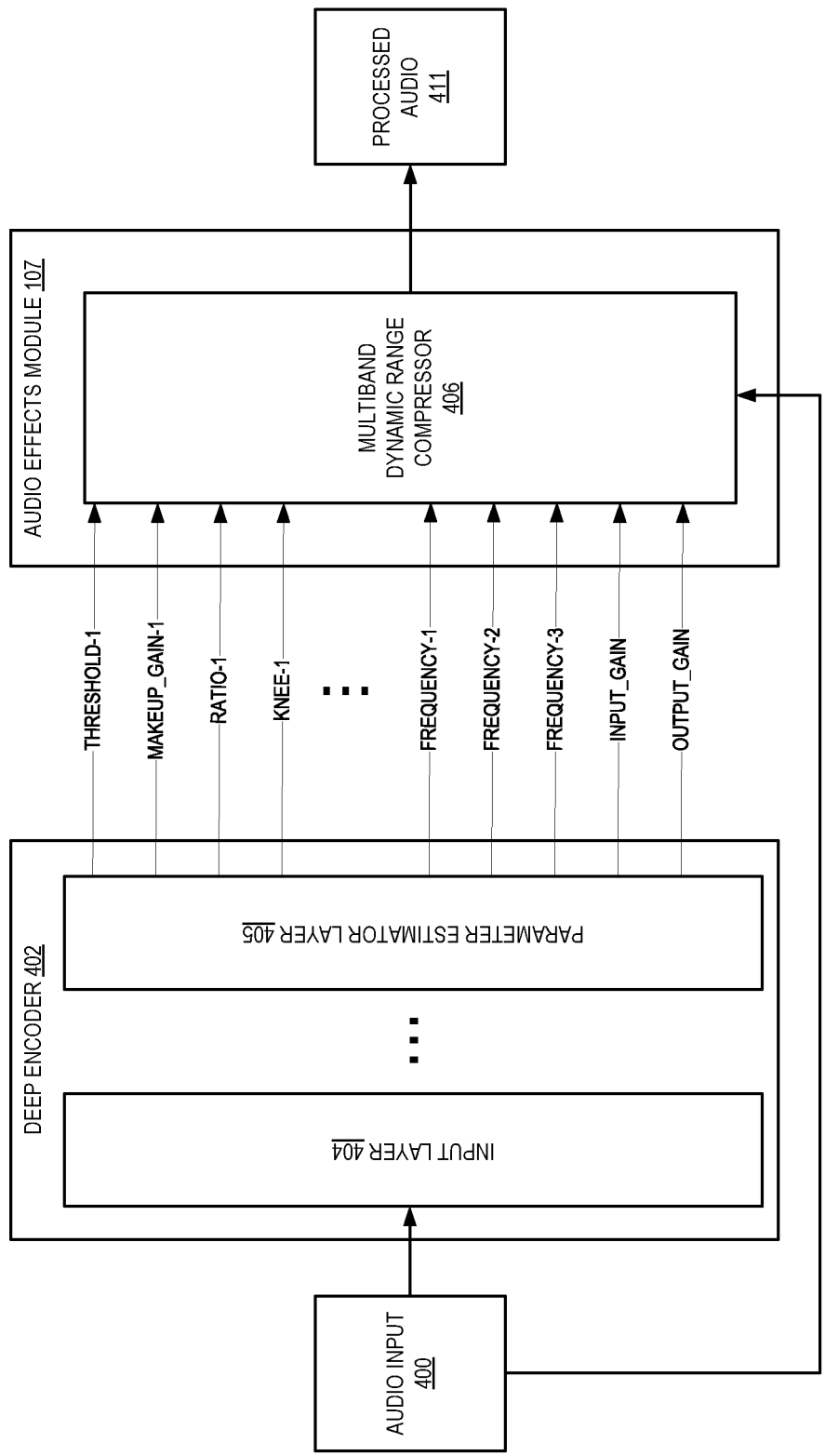
FIG. 4 illustrates an example tube amplifier emulation audio processing effect performed by an audio signal processing system in accordance with one or more embodiments.

FIG. 4 illustrates an example tube amplifier emulation audio processing effect performed by an audio signal processing system in accordance with one or more embodiments. In one or more embodiments, the audio signal processing system uses a multiband dynamic range compressor 406 as a black-box function of an audio effects module 107 to perform tube amplifier emulation. As described previously, the deep encoder 402 has been trained to estimate the parameters that are provided to the multiband dynamic range compressor 406. A compressor modifies the amplitude dynamics of audio by applying a time-varying gain. Compressors are commonly used for loudness control and typically introduce little harmonic distortion in contrast to tube amplifiers. In one or more embodiments, the deep encoder 402 learns 21 audio effects parameters: the threshold, makeup gain, ratio, and knee for each of the 4 frequency bands; the 3 frequency splits; and the input and output gains on a Calf LV2 effect. In one example, the training data is a subset of the IDMT-SMT-Audio-Effects dataset including 1250 raw notes from various electric guitars and bass guitars and processed through a Universal Audio 6176 Vintage Channel Strip tube preamplifier. In one or more embodiments, the train, validation, and test dataset sizes are 31.6, 4.0, and 4.0 minutes, respectively. In one or more embodiments, for all audio processing effects, the non-trainable audio effects parameters are set to defaults with the exception of the attack and release gates, which are set to their minimum (ten milliseconds) due to the fast control rate of the model (46 milliseconds).

In the example of FIG. 4, the audio signal processing system receives an audio input 400 and a request to perform tube amplifier emulation. As illustrated in FIG. 4, an input layer 404 in the deep encoder 402 receives the audio input 400. The input layer 404 may be used to receive inputs for the deep encoder 402 and perform initial processing. While only an input layer 404 and a parameter estimator layer 405 are depicted in FIG. 4, the deep encoder 402 may include fewer, additional, and/or different layers. The parameter estimator layer 405 generates values for each of the 21 audio effects parameters and send the parameters to the audio effects module 107. As noted above, to perform tube amplifier emulation, the audio signal processing system uses a multiband dynamic range compressor 406. Continuing the example of FIG. 4, the 21 audio effects parameters for performing the tube amplifier emulation audio processing effect are fed to the multiband dynamic range compressor 406. The multiband dynamic range compressor 406 transforms/processes the audio input 400 based on the provided parameters and generates processed audio 411 as the output of the audio signal processing system.

Figure 5:
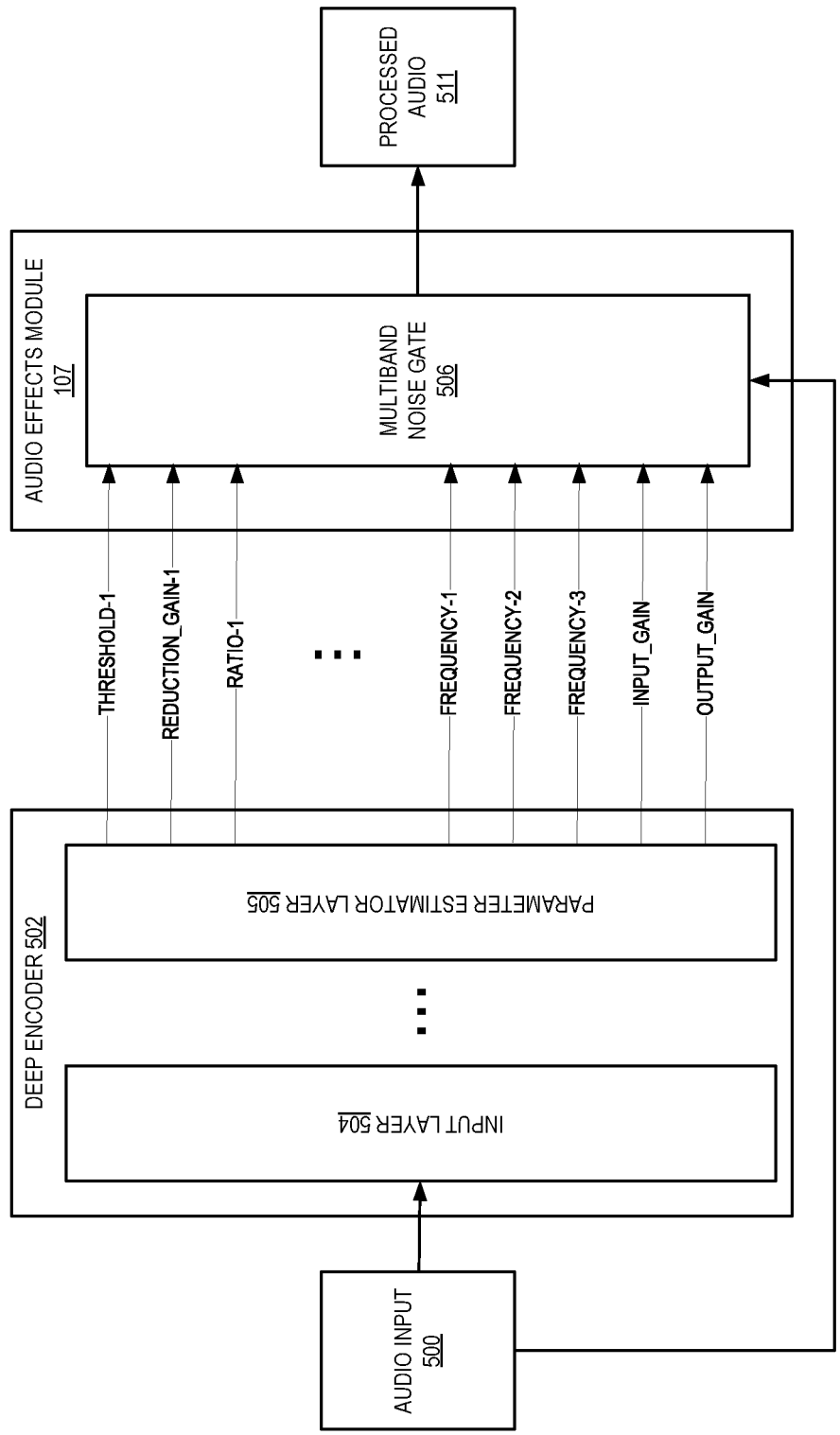
FIG. 5 illustrates an example automatic non-speech vocal sounds removal audio processing effect performed by an audio signal processing system in accordance with one or more embodiments.

FIG. 5 illustrates an example automatic non-speech vocal sounds removal audio processing effect performed by an audio signal processing system in accordance with one or more embodiments. In one or more embodiments, the audio signal processing system is trained to use a multiband noise gate 506 as a black-box function of an audio effects module 107 to perform automatic non-speech vocal sounds removal to remove extraneous sounds, such as breathing, lip smacks, clicking sounds, reverberations, and other extraneous noises. As described previously, the deep encoder 502 has been trained to estimate the parameters that are provided to the multiband noise gate 506. This process can be performed manually editing the audio waveform or by using a noise gate, to reduce signal below a certain threshold via a reduction gain and ratio setting. However, both of these approaches can be time consuming and require expert knowledge. In one or more embodiments, the deep encoder 502_learns 17 audio effects parameters: the threshold, reduction gain, and ratio for each of the 4 frequency bands; the 3 frequency splits; and the input and output gains. In one or more embodiments, the training data is the DAPS dataset, which includes 100 raw and clean speech recordings with manually removed breaths, lip smacks, clicks, reverberations, etc. In one or more embodiments, the train, validation, and test dataset size is 213.5, 30.2, and 23.8 minutes, respectively.

In the example of FIG. 5, the audio signal processing system receives an audio input 500 and a request to perform non-speech vocal sounds removal. As illustrated in FIG. 5, an input layer 504 in the deep encoder 502 receives the audio input 500. The input layer 504 may be used to receive inputs for the deep encoder 502 and perform initial processing. While only an input layer 504 and a parameter estimator layer 505 are depicted in FIG. 5, the deep encoder 502 may include fewer, additional, and/or different layers. The parameter estimator layer 505 generates values for each of the 17 audio effects parameters and send the parameters to the audio effects module 107. As noted above, to perform non-speech vocal sounds removal, the audio signal processing system uses a multiband noise gate 506. Continuing the example of FIG. 5, the 17 audio effects parameters for performing the tube amplifier emulation audio processing effect are fed to the multiband noise gate 506. The multiband noise gate 506 transforms/processes the audio input 500 based on the provided parameters and generates processed audio 511 as the output of the audio signal processing system.

Figure 6:
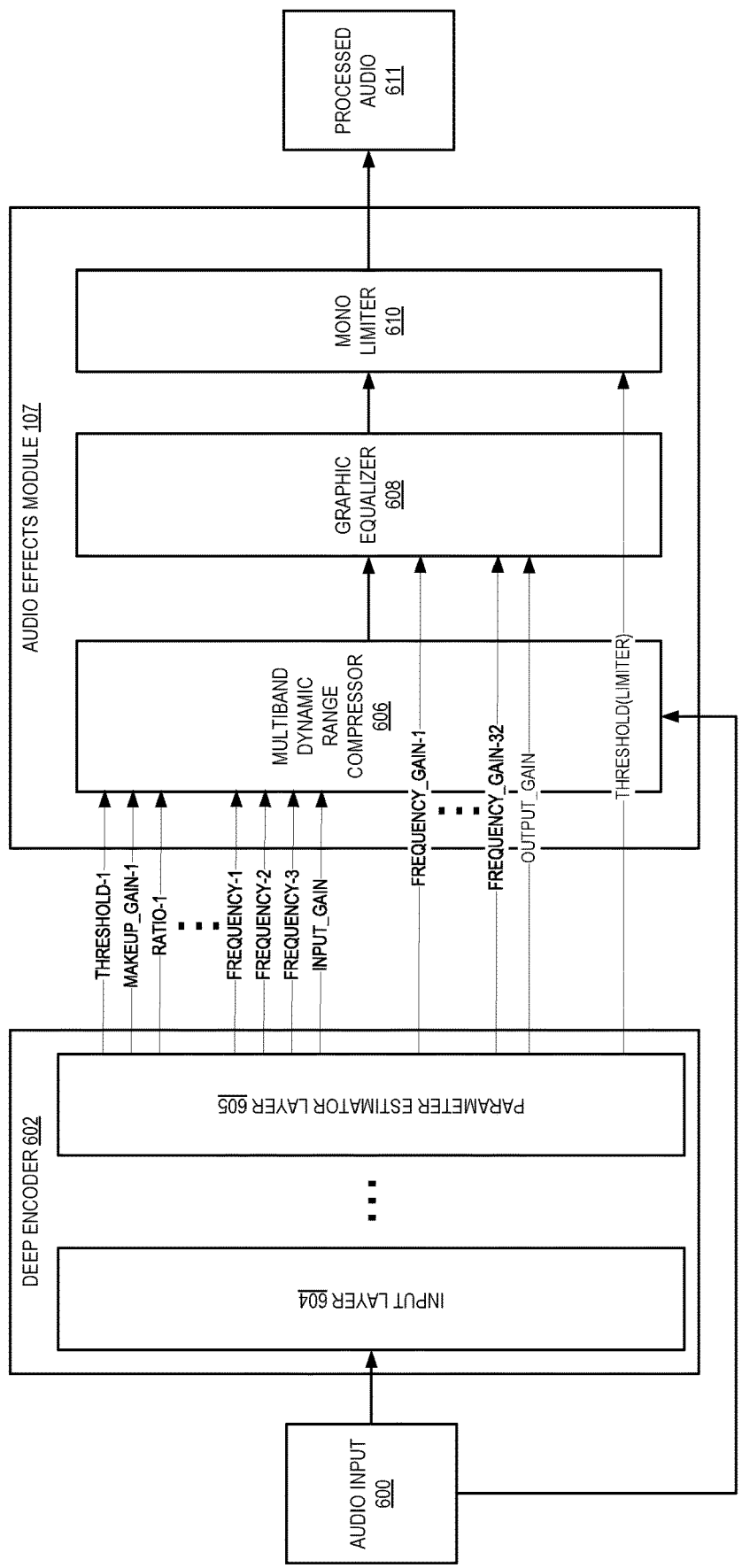
FIG. 6 illustrates an example music mastering audio processing effect performed by an audio signal processing system in accordance with one or more embodiments.

FIG. 6 illustrates an example music mastering audio processing effect performed by an audio signal processing system in accordance with one or more embodiments. In one or more embodiments, the audio signal processing system is trained to use multiple audio effects in series to perform music mastering. Music post-production or mastering is the process of enhancing a recording by manipulating its dynamics and frequency content. This manipulation is typically done by an experienced mastering engineer and is carried out using dynamic range effects, such as a compressor and limiter; and frequency-based processors, such as an equalizer. In one or more embodiments, the audio signal processing system is trained to use a multiband dynamic range compressor 606, a graph equalizer 608, and a mono limiter 610 as a series of black-box functions of an audio effects module 107 to perform the music mastering. In one or more embodiments, as described previously, the deep encoder 602 has been trained to estimate 50 audio effects parameters: 16 parameters for the multiband dynamic range compressor 606 (threshold, makeup gain and ratio for each of the 4 frequency bands; the 3 frequency splits; and the input gain), 33 parameters for the graph equalizer 608 (the gain for each of the 32 frequency bands and the output gain), and one parameter for the mono limiter 610 (threshold). In one or more embodiments, the training data includes 138 unmastered and mastered music tracks. In one or more embodiments, a progressive training process is used to train when there are multiple audio effects in series to perform an audio effect. For example, for music mastering, all 50 parameters are initialized to their default values and then train each audio effect serially, starting with the multiband compressor, and when the loss is reaches a minimum value, proceed to train the graphic equalizer, and then the limiter. In one or more embodiments, as a preprocessing step, time-alignment using cross-correlation and loudness is performed to normalize each unmastered track to −25 dBFS. In one or more embodiments, the train, validation, and test dataset size is 429.3, 51.1, and 50.3 minutes, and respectively.

In the example of FIG. 6, the audio signal processing system receives an audio input 600 and a request to perform music mastering. As illustrated in FIG. 6, an input layer 604 in the deep encoder 602 receives the audio input 600. The input layer 604 may be used to receive inputs for the deep encoder 602 and perform initial processing. While only an input layer 604 and a parameter estimator layer 605 are depicted in FIG. 6, the deep encoder 602 may include fewer, additional, and/or different layers. The parameter estimator layer 605 generates values for each of the 50 audio effects parameters and send the parameters to the audio effects module 107. As noted above, to perform music mastering, the audio signal processing system uses a multiband dynamic range compressor 606, a graph equalizer 608, and a mono limiter 610. Continuing the example of FIG. 6, the audio effects parameters for performing the music mastering audio processing effect are first fed to the multiband dynamic range compressor 606. For example, the 16 audio effects parameters are sent to the multiband dynamic range compressor 606. The multiband dynamic range compressor 606 transforms/processes the audio input 600 based on the provided parameters and passes the output to the graph equalizer 608. The graph equalizer 608 receives the 33 audio effects parameters and processes the output from the multiband dynamic range compressor 606 and generates an output that is passed to the mono limiter 610. The mono limiter 610 receives the one audio effects parameter and processes the output from the graph equalizer 608 and generates processed audio 611 as the output of the audio signal processing system.

Figure 7:
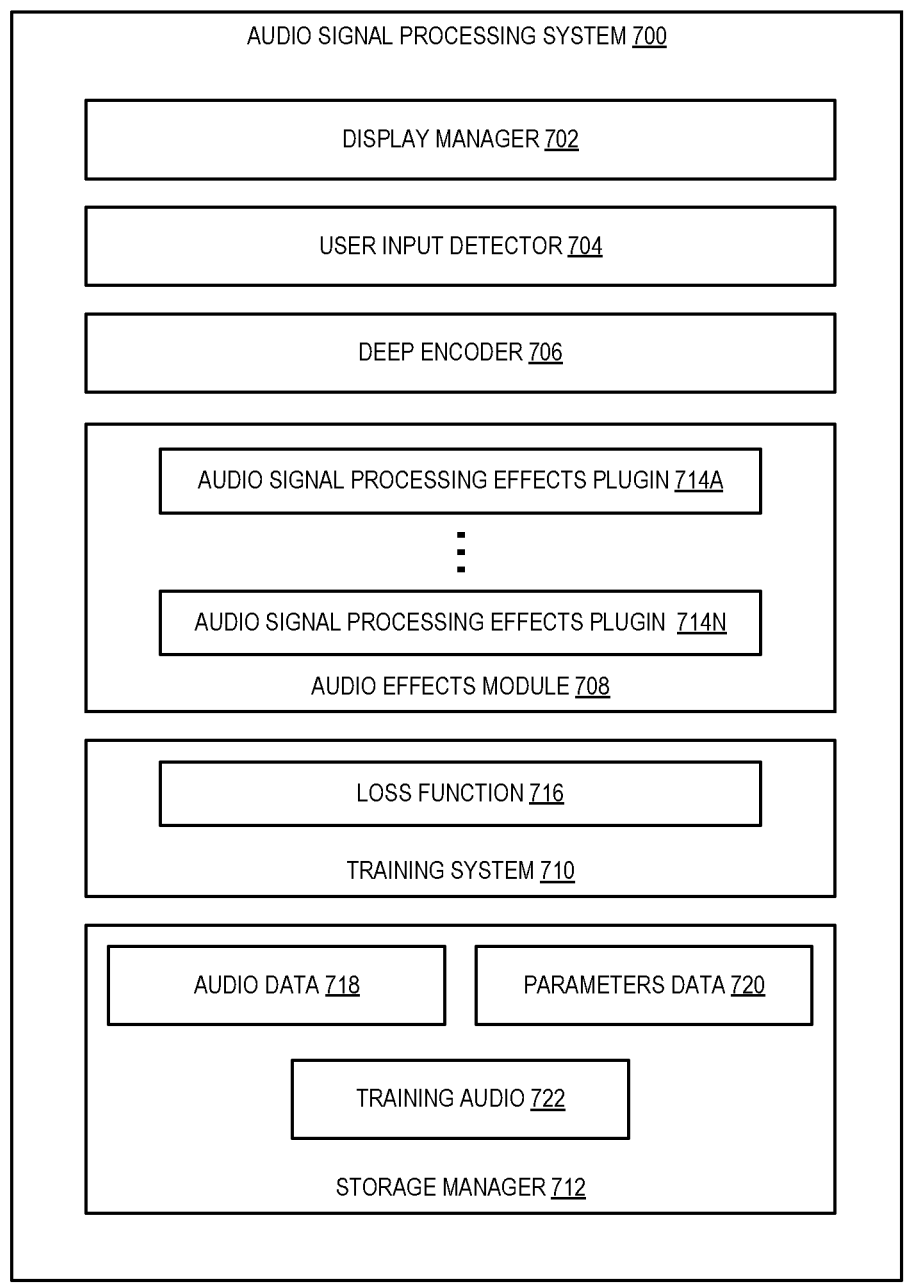
FIG. 7 illustrates a schematic diagram of audio signal processing system in accordance with one or more embodiments.

FIG. 7 illustrates a schematic diagram of an audio signal processing system (e.g., "audio signal processing system" described above) in accordance with one or more embodiments. As shown, the audio signal processing system 700 may include, but is not limited to, a display manager 702, a user input detector 704, a deep encoder 706, an audio effect module 708, a training system 710 (e.g., training system 202 described above), and a storage manager 712. The audio effect module 708 includes audio signal processing effects plugin 714A-714N. The training system 710 includes a loss function 716. The storage manager 712 includes audio data 718, parameters data 720, and training audio 722.

As illustrated in FIG. 7, the audio signal processing system 700 includes a display manager 702. In one or more embodiments, the display manager 702 identifies, provides, manages, and/or controls a user interface provided on a computing device. Examples of displays include interactive whiteboards, graphical user interfaces (or simply "user interfaces") that allow a user to view and interact with content items, or other items capable of display on a display screen. For example, the display manager 702 may identify, display, update, or otherwise provide various user interfaces that include one or more display elements in various layouts. In one or more embodiments, the display manager 702 can identify a display provided on a touch screen. For example, a display provided on a touch screen may include a graphical user interface including one or more display elements capable of being interacted with via one or more touch gestures or other types of user inputs (e.g., using a stylus, a mouse, or other input devices). In one or more other embodiments, the display manager 702 can identify other types of displays (e.g., including monitors, projectors, headsets, etc.) that may be interacted with using a variety of input devices.

More specifically, the display manager 702 can identify a variety of display elements within a graphical user interface as well as the layout of the graphical user interface. For example, the display manager 702 may identify a graphical user interface including one or more display elements. Display elements include, but are not limited to buttons, text boxes, menus, thumbnails, scroll bars, hyperlinks, etc. In one or more embodiments, the display manager 702 can identify a graphical user interface layout as well as the display elements displayed therein.

As further illustrated in FIG. 7, the audio signal processing system 700 also includes a user input detector 704. In one or more embodiments, the user input detector 704 detects, receives, and/or facilitates user inputs in any suitable manner. In some examples, the user input detector 704 detects one or more user interactions. As referred to herein, a "user interaction" means a single input, or combination of inputs, received from a user by way of one or more input devices, or via one or more touch gestures. In some examples, the user input detector 704 can detect user interactions in relation to and/or directed at one or more display elements displayed as part of a display. In one or more embodiments, the user inputs can include those performed by a user to send inputs to the audio signal processing system 700.

The user input detector 704 may additionally, or alternatively, receive data representative of a user interaction. For example, the user input detector 704 may receive one or more user configurable parameters from a user, one or more commands from the user, and/or any other suitable user input. In particular, the user input detector 704 can receive voice commands or otherwise sense, detect, or receive user input.

As illustrated in FIG. 7, the audio signal processing system 700 includes a deep encoder 706. In one or more embodiments, the deep encoder 706 can be any deep learning architecture for learning representations of audio. The deep encoder 706 can receive or retrieve unprocessed audio as input from a computing device or from a storage location (e.g., storage manager 712). The unprocessed audio can be processed by the deep encoder to estimate parameters for one or more audio signal processing effects, as described above. In one or more embodiments, the deep encoder includes a plurality of layers, including an input layer that receives inputs and performs initial processing and a parameter estimator layer, which estimates the parameters of one or more black-box audio effects (e.g., one or more audio signal processing effects plugins 714A-714N) to be used by the audio effects module 708 to perform signal processing/transformation. As discussed, the deep encoder processes frames of the unprocessed audio input individually or in a batch, and parameters are estimated for each frame of the unprocessed audio. The parameters may include any parameters used for audio signal processing including, for example, threshold, makeup gain, ratio, frequency splits, input gain, output gain, etc.

As further illustrated in FIG. 7, the audio signal processing system 700 also includes an audio effects module 708. In one or more embodiments, the audio effects module 708 includes one or more audio signal processing effects plugins 714A-714N. In one or more embodiments, the one or more audio signal processing effects plugins 714A-714N are stateful black-box audio processing effects. Each of the one or more audio signal processing effects plugins 714A-714N is configured to perform a transformation of an input audio based on one or more parameters. Multiple audio signal processing effects plugins 714A-714N can be grouped together to perform various audio processing effects. The audio effects module 708 can receive or retrieve unprocessed audio and parameters associated with the one or more audio signal processing effects plugins 714A-714N from a computing device or from a storage (e.g., storage manager 712). The one or more audio signal processing effects plugins 714A-714N process the unprocessed audio using the received parameters and outputs processed audio. In one or more embodiments, audio effects that can be performed on the unprocessed audio can include tube amplifier emulation, automatic non-speech sounds removal, and automatic music post-production or mastering.

As further illustrated in FIG. 7, the audio signal processing system 700 includes training system 710 which is configured to teach, guide, tune, and/or train one or more neural networks. In particular, the training system 710 trains a neural network, such as deep encoder 706, based on a plurality of training data (e.g., training audio 722). In one or more embodiments, the training audio include consecutive non-overlapping frames of digital audio. The consecutive frames are serially provided to the deep encoder which then learns to estimate audio effects parameters which, when applied to one or more audio signal processing effects plugins, generate a processed audio output. More specifically, the training system 710 is configured to access, identify, generate, create, and/or determine training input and utilize the training input to train and fine-tune a neural network. For instance, the training system 710 trains the deep encoder 706 to learn to estimate parameters for one or more audio signal processing effects plugins using loss function 716. Loss function 716, as discussed above, compares processed audio generated by the audio effect module 708 to a target audio. Training system 710 trains deep encoder 706 to minimize the loss.

As illustrated in FIG. 7, the audio signal processing system 700 also includes the storage manager 712. The storage manager 712 maintains data for the audio signal processing system 700. The storage manager 712 can maintain data of any type, size, or kind as necessary to perform the functions of the audio signal processing system 700. The storage manager 712, as shown in FIG. 7, includes audio data 718, parameters data 720, and training audio 722. The audio data 718 can include unprocessed audio received as inputs from a computing device, processed audio generated by the audio effects module 107, and/or training audio used for training the deep encoder 706, as discussed in additional detail above. For example, the unprocessed audio input can be temporarily stored in audio data 718 in the storage manager 712 when received from a computing device until retrieved or sent to the deep encoder 706 and audio effects module 708 for processing. The parameters data 720 can include the parameters generated by the deep encoder and associated with one or more of the audio signal processing effects plugins 714A-714N. The training audio 722 can include audio frames for training the deep encoder 706. As audio effects are stateful systems, the training audio 722 can include consecutive non-overlapping frames of audio.

Embodiments described above explored two deep encoder variants: an Inception network and MobileNetV2. The number of parameters for each deep encoder variant is approximately 2.8M and 2.2M, respectively. The input context $\hat{x}$ and current audio frame x are 40960 and 1024 samples (1.85 seconds and 46 milliseconds) at a 22,050 Hz sampling rate. The log-scaled mel-spectrogram input layer has a 46 milliseconds window size, 25% overlap, and 128 mel-bands. The audio effects used are from the LV2 audio plugin open standard with continuous parameters scaled between 0 and 1. The final optimization scheme with the Inception encoder and parametric equalizer Fx (EQ) takes 3 minutes per epoch (1000 steps) to train with batch size M=100 on a Tesla-V100 GPU.

The quantitative evaluation is shown in Table 2, below. The quantitative evaluation includes a number of training epochs until early stopping, training time in hours, and the mean cosine distance of the mel-frequency cepstral coefficients, or $\bar{d}_{MFCC}$, as a proxy for a perceptual metric. Thirteen MFCCs were computed from a log-power mel-spectrogram using a window size of 1024 samples, 25% hop size and 128 bands. As a baseline for the tube amplifier emulation effect, the Convolutional Audio Effects Modeling Network (CAFx) was used, and for the music mastering effect, an online mastering software (OMS) was used. As shown in Table 2, the tube amplified emulation distance was greater than for the other two audio processing effects, likely caused by using a compressor to achieve distortion. As shown in Table 2, both encoders achieved similar performance, although the Inception model tends to perform slightly better, and all training times are under a day. As shown in Table 2, the CAFx and OMS models have lower distances.

TABLE 2

Experimental Performance Comparison

| | Model | Epochs | Time | $\bar{d}_{MFCC}$ |
|---|---|---|---|---|
| Tube amplifier emulation | Inception | 97 | 9.07 | 0.2596 |
| | MobileNetV2 | 63 | 6.4 | 0.2186 |
| | CAFx | 723 | 5.5 | 0.0826 |
| Non-speech sounds removal | Inception | 89 | 7.4 | 0.0186 |
| | MobileNetV2 | 60 | 4.8 | 0.0231 |
| Music mastering | Inception | 202 | 19.8 | 0.0282 |
| | MobileNetV2 | 178 | 17.5 | 0.0542 |
| | OMS | — | — | 0.0157 |

Each of the components 702-712 of the audio signal processing system 700 and their corresponding elements (as shown in FIG. 7) may be in communication with one another using any suitable communication technologies. It will be recognized that although components 702-712 and their corresponding elements are shown to be separate in FIG. 7, any of components 702-712 and their corresponding elements may be combined into fewer components, such as into a single facility or module, divided into more components, or configured into different components as may serve a particular embodiment.

The components 702-712 and their corresponding elements can comprise software, hardware, or both. For example, the components 702-712 and their corresponding elements can comprise one or more instructions stored on a computer-readable storage medium and executable by processors of one or more computing devices. When executed by the one or more processors, the computer-executable instructions of the audio signal processing system 700 can cause a client device and/or a server device to perform the methods described herein. Alternatively, the components 702-712 and their corresponding elements can comprise hardware, such as a special purpose processing device to perform a certain function or group of functions. Additionally, the components 702-712 and their corresponding elements can comprise a combination of computer-executable instructions and hardware.

Furthermore, the components 702-712 of the audio signal processing system 700 may, for example, be implemented as one or more stand-alone applications, as one or more modules of an application, as one or more plug-ins, as one or more library functions or functions that may be called by other applications, and/or as a cloud-computing model. Thus, the components 702-712 of the audio signal processing system 700 may be implemented as a stand-alone application, such as a desktop or mobile application. Furthermore, the components 702-712 of the audio signal processing system 700 may be implemented as one or more web-based applications hosted on a remote server. Alternatively, or additionally, the components of the audio signal processing system 700 may be implemented in a suit of mobile device applications or "apps." To illustrate, the components of the audio signal processing system 700 may be implemented in an audio editing application, including but not limited to ADOBE® Premiere Pro and ADOBE® Audition. "ADOBE®" is either a registered trademark or trademark of Adobe Inc. in the United States and/or other countries.

Figure 8:
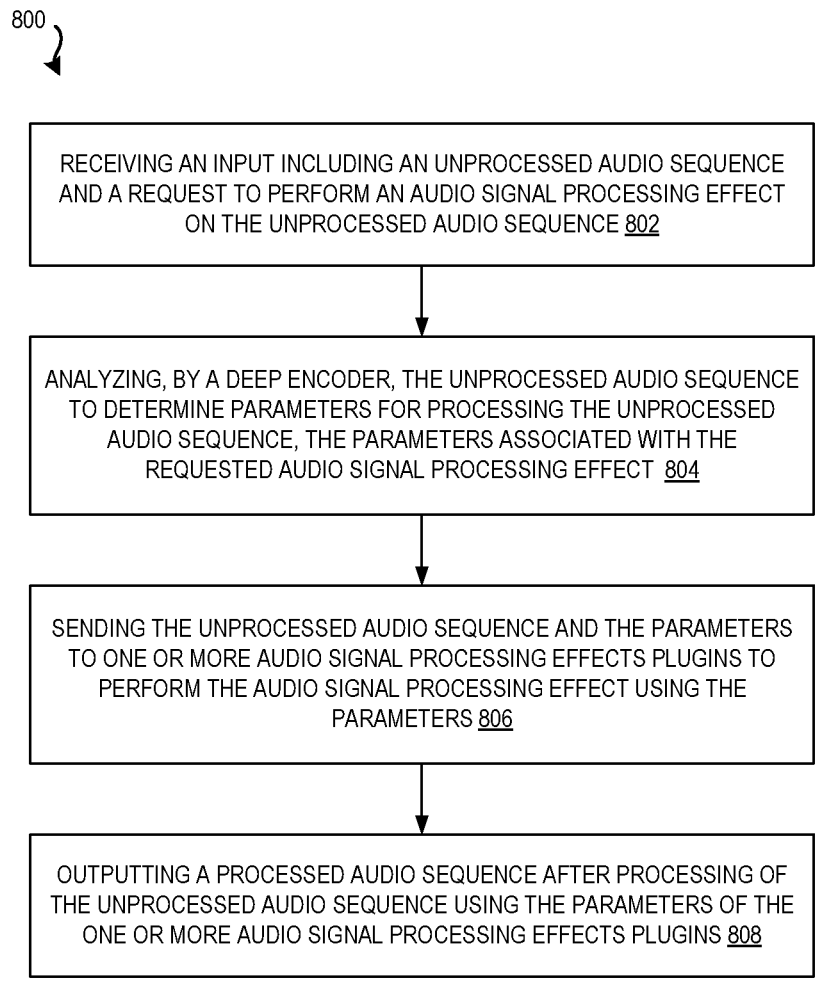
FIG. 8 illustrates a flowchart of a series of acts in a method of performing an audio processing effect on an unprocessed audio sequence using parameters estimated by a deep encoder in accordance with one or more embodiments.

FIGS. 1-7, the corresponding text, and the examples, provide a number of different systems and devices that allows an audio signal processing system to perform an audio processing effect on an unprocessed audio sequence using parameters estimated by a deep encoder. In addition to the foregoing, embodiments can also be described in terms of flowcharts comprising acts and steps in a method for accomplishing a particular result. For example, FIG. 8 illustrates a flowchart of an exemplary method in accordance with one or more embodiments. The method described in relation to FIG. 8 may be performed with less or more steps/acts or the steps/acts may be performed in differing orders. Additionally, the steps/acts described herein may be repeated or performed in parallel with one another or in parallel with different instances of the same or similar steps/acts.

FIG. 8 illustrates a flowchart 800 of a series of acts in a method of performing an audio processing effect on an unprocessed audio sequence using parameters estimated by a deep encoder in accordance with one or more embodiments. In one or more embodiments, the method 800 is performed in a digital medium environment that includes the audio signal processing system 700. The method 800 is intended to be illustrative of one or more methods in accordance with the present disclosure and is not intended to limit potential embodiments. Alternative embodiments can include additional, fewer, or different steps than those articulated in FIG. 8.

As shown in FIG. 8, the method 800 includes an act 802 of receiving, by an audio signal processing system, an input including an unprocessed audio sequence and a request to perform an audio signal processing effect on the unprocessed audio sequence. In some embodiments, the machine-learning backed service may be a web service, or other application, configured to receive requests over one or more networks (e.g., the Internet). For example, a machine-learning backed service may be a web service or other application that uses machine learning techniques to perform one or more requested actions. In some embodiments, the request may be received from an application executing on a client computing device, such as an audio editing application, web browser, or other application.

As shown in FIG. 8, the method 800 also includes an act 804 of analyzing, by a deep encoder, the unprocessed audio sequence to determine parameters for processing the unprocessed audio sequence, the parameters associated with the requested audio signal processing effect. One or more machine learning techniques may be used to analyze and/or process the unprocessed audio sequence. For example, an input layer of the deep encoder may receive the unprocessed audio sequence. In one or more embodiments, the unprocessed audio sequence is input into the deep encoder frame-by-frame or as segments of frame. Further, a parameter estimator layer of the deep encoder may analyze the unprocessed audio sequence to generate one or more parameters for one or the more audio signal processing effects plugins based on the unprocessed audio sequence. In one or more embodiments, the parameter estimator layer includes functions used to estimate the parameters. The parameters may include any parameters used for audio signal processing including, for example, threshold, makeup gain, ratio, frequency splits, input gain, output gain, etc. In one or more embodiments, the deep encoder can store the one or more parameters in a memory or storage location for later retrieval by or sending to the one or more audio signal processing effects plugins.

In some embodiments, the deep encoder is trained using a training system configured to obtain training audio data, the training audio data including at least one training audio file and an associated ground truth audio file corresponding to the audio signal processing effect, configure the deep encoder for the audio signal processing effect by serially adding each audio signal processing effects plugin of the one or more audio signal processing effects plugins to the deep encoder, analyze, by the deep encoder, the training audio data to estimate values of training parameters for processing the training audio, provide the estimated training parameters and the training audio to the one or more audio signal processing effects plugins which generate a training output, calculate, using a loss function, a loss of the training output and the ground truth audio file, and train the deep encoder based on the loss.

In some embodiments, calculating the loss further includes determining a number of audio frames representing a delay between the ground truth audio data and the training output, removing the number of audio frames representing the delay, aligning the ground truth audio data and the training output, calculating a polarity, calculating a first loss value with a non-inverted polarity and a second loss value with an inverted polarity, and selecting a minimum of the first loss value and the second loss value as the loss value. In some embodiments, for each frame of each input audio file in the training audio data, the training system analyzes, by the deep encoder, a first frame of the input audio file having a first frame length, and generates a second frame of the input audio file from the first frame, the second frame having a second frame length, wherein the second frame length is shorter than the first frame length.

In some embodiments, the training system, for each input audio file in the training audio data, instantiates a first audio signal processing effects plugin to generate output audio frames based on the second frame and the estimated training parameters, and instantiates a second audio signal processing effects plugin and a third audio signal processing effects plugin to determine gradients of the estimated training parameters based on the second frame and the estimated training parameters, wherein a same state is maintained for each of the first audio signal processing effects plugin, the second audio signal processing effects plugin, and the third audio signal processing effects plugin. In some embodiments, the training system backpropagates the determined gradients of the estimated training parameters to the deep encoder and the one or more audio signal processing effects plugins. In some embodiments, the training system approximates the gradients of the estimated training parameters using a simultaneous perturbation stochastic approximation method.

As shown in FIG. 8, the method 800 also includes an act 806 of sending, by the deep encoder, the unprocessed audio sequence and the parameters to one or more audio signal processing effects plugins to perform the audio signal processing effect using the parameters. In one or more embodiments, the one or more audio signal processing effects plugins use the parameters generated by the deep encoder to transform/process the unprocessed audio sequence to generate the processed audio sequence.

As shown in FIG. 8, the method 800 also includes an act 808 of outputting, by audio signal processing system, a processed audio sequence after processing of the unprocessed audio sequence using the parameters of the one or more audio signal processing effects plugins. In one or more embodiments, the machine-learning backed service sends the processed audio sequence to a client computing device which originated the request or to another computing device. In one or more embodiments, the machine-learning backed service stores the processed audio in a memory or storage location.

In some embodiments, the audio signal processing effect is a tube amplifier emulation audio processing effect, wherein the one or more audio signal processing effects plugins include a multiband dynamic range compressor, and wherein the parameters include a threshold, makeup gain, ratio, and knee for each frequency band, frequency splits, an input gain, and an output gain.

In some embodiments, the audio signal processing effect is an automatic non-speech vocal sounds removal audio processing effect, wherein the one or more audio signal processing effects plugins include multiband noise gate, and wherein the parameters include a threshold, reduction gain, and ratio for each frequency band, frequency splits, an input gain, and an output gain.

In some embodiments, the audio signal processing effect is a music mastering audio processing effect, and wherein the one or more audio signal processing effects plugins include a multiband dynamic range compressor, a graphic equalizer, and a mono limiter, and wherein the parameters include a threshold, makeup gain and ratio for each frequency band, frequency splits, and an input gain for the multiband dynamic range compressor, a gain for each frequency band and an output gain for the graphic equalizer, and a threshold for the mono limiter.

Figure 9:
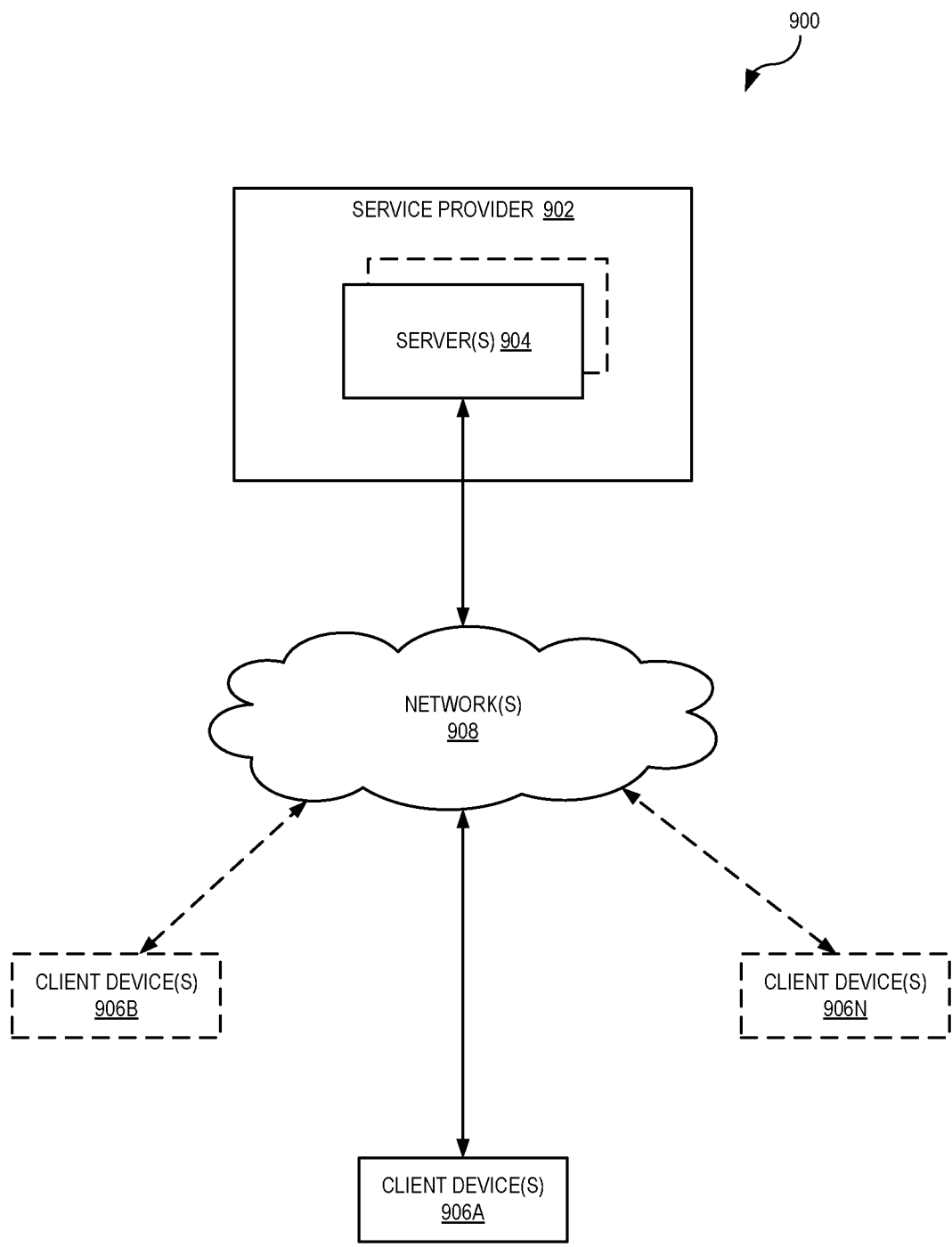
FIG. 9 illustrates a schematic diagram of an exemplary environment in which the audio signal processing system can operate in accordance with one or more embodiments.

In one or more embodiments, after receiving the processed audio sequence output from the audio signal processing system, a user can provide inputs to modify elements of the deep encoder for further refinements. For example, the user can provide inputs that adjust generated parameters controls of the one or more audio effects at the deep encoder. After these modifications are applied to the deep encoder, the unprocessed audio sequence can be re-processed through the audio signal processing system to generate and output a refined processed audio sequence. In such embodiments, FIG. 9 illustrates a schematic diagram of an exemplary environment 900 in which the audio signal processing system 700 can operate in accordance with one or more embodiments. In one or more embodiments, the environment 900 includes a service provider 902 which may include one or more servers 904 connected to a plurality of client devices 906A-906N via one or more networks 908. The client devices 906A-906N, the one or more networks 908, the service provider 902, and the one or more servers 904 may communicate with each other or other components using any communication platforms and technologies suitable for transporting data and/or communication signals, including any known communication technologies, devices, media, and protocols supportive of remote data communications, examples of which will be described in more detail below with respect to FIG. 10.

Although FIG. 9 illustrates a particular arrangement of the client devices 906A-906N, the one or more networks 908, the service provider 902, and the one or more servers 904, various additional arrangements are possible. For example, the client devices 906A-906N may directly communicate with the one or more servers 904, bypassing the network 908. Or alternatively, the client devices 906A-906N may directly communicate with each other. The service provider 902 may be a public cloud service provider which owns and operates their own infrastructure in one or more data centers and provides this infrastructure to customers and end users on demand to host applications on the one or more servers 904. The servers may include one or more hardware servers (e.g., hosts), each with its own computing resources (e.g., processors, memory, disk space, networking bandwidth, etc.) which may be securely divided between multiple customers, each of which may host their own applications on the one or more servers 904. In some embodiments, the service provider may be a private cloud provider which maintains cloud infrastructure for a single organization. The one or more servers 904 may similarly include one or more hardware servers, each with its own computing resources, which are divided among applications hosted by the one or more servers for use by members of the organization or their customers.

Similarly, although the environment 900 of FIG. 9 is depicted as having various components, the environment 900 may have additional or alternative components. For example, the environment 900 can be implemented on a single computing device with the audio signal processing system 700. In particular, the audio signal processing system 700 may be implemented in whole or in part on the client device 902A.

As illustrated in FIG. 9, the environment 900 may include client devices 906A-906N. The client devices 906A-906N may comprise any computing device. For example, client devices 906A-906N may comprise one or more personal computers, laptop computers, mobile devices, mobile phones, tablets, special purpose computers, TVs, or other computing devices, including computing devices described below with regard to FIG. 10. Although three client devices are shown in FIG. 9, it will be appreciated that client devices 906A-906N may comprise any number of client devices (greater or smaller than shown).

Moreover, as illustrated in FIG. 9, the client devices 906A-906N and the one or more servers 904 may communicate via one or more networks 908. The one or more networks 908 may represent a single network or a collection of networks (such as the Internet, a corporate intranet, a virtual private network (VPN), a local area network (LAN), a wireless local network (WLAN), a cellular network, a wide area network (WAN), a metropolitan area network (MAN), or a combination of two or more such networks. Thus, the one or more networks 908 may be any suitable network over which the client devices 906A-906N may access service provider 902 and server 904, or vice versa. The one or more networks 908 will be discussed in more detail below with regard to FIG. 10.

In addition, the environment 900 may also include one or more servers 904. The one or more servers 904 may generate, store, receive, and transmit any type of data, including audio data 718, parameters data 720, training audio 722, or other information. For example, a server 904 may receive data from a client device, such as the client device 906A, and send the data to another client device, such as the client device 902B and/or 902N. The server 904 can also transmit electronic messages between one or more users of the environment 900. In one example embodiment, the server 904 is a data server. The server 904 can also comprise a communication server or a web-hosting server. Additional details regarding the server 904 will be discussed below with respect to FIG. 10.

As mentioned, in one or more embodiments, the one or more servers 904 can include or implement at least a portion of the audio signal processing system 700. In particular, the audio signal processing system 700 can comprise an application running on the one or more servers 904 or a portion of the audio signal processing system 700 can be downloaded from the one or more servers 904. For example, the audio signal processing system 700 can include a web hosting application that allows the client devices 906A-906N to interact with content hosted at the one or more servers 904. To illustrate, in one or more embodiments of the environment 900, one or more client devices 906A-906N can access a webpage supported by the one or more servers 904. In particular, the client device 906A can run a web application (e.g., a web browser) to allow a user to access, view, and/or interact with a webpage or website hosted at the one or more servers 904.

Upon the client device 906A accessing a webpage or other web application hosted at the one or more servers 904, in one or more embodiments, the one or more servers 904 can provide a user of the client device 906A with an interface to provide an input (e.g., text or a document including text), or an interface to select a portion of a document including text. In one or more embodiments, the one or more servers 904 can further provide a user of the client device 906A with an interface to provide color selections. Upon receiving the input text and the color selections, the one or more servers 904 can automatically perform the methods and processes described above to apply a color gradient to the input text. The one or more servers 904 can provide an output including the input text with the applied color gradient to the client device 906A for display to the user.

As just described, the audio signal processing system 700 may be implemented in whole, or in part, by the individual elements 902-908 of the environment 900. It will be appreciated that although certain components of the audio signal processing system 700 are described in the previous examples with regard to particular elements of the environment 900, various alternative implementations are possible. For instance, in one or more embodiments, the audio signal processing system 700 is implemented on any of the client devices 906A-N. Similarly, in one or more embodiments, the audio signal processing system 700 may be implemented on the one or more servers 904. Moreover, different components and functions of the audio signal processing system 700 may be implemented separately among client devices 906A-906N, the one or more servers 904, and the network 908.

Embodiments of the present disclosure may comprise or utilize a special purpose or general-purpose computer including computer hardware, such as, for example, one or more processors and system memory, as discussed in greater detail below. Embodiments within the scope of the present disclosure also include physical and other computer-readable media for carrying or storing computer-executable instructions and/or data structures. In particular, one or more of the processes described herein may be implemented at least in part as instructions embodied in a non-transitory computer-readable medium and executable by one or more computing devices (e.g., any of the media content access devices described herein). In general, a processor (e.g., a microprocessor) receives instructions, from a non-transitory computer-readable medium, (e.g., a memory, etc.), and executes those instructions, thereby performing one or more processes, including one or more of the processes described herein.

Computer-readable media can be any available media that can be accessed by a general purpose or special purpose computer system. Computer-readable media that store computer-executable instructions are non-transitory computer-readable storage media (devices). Computer-readable media that carry computer-executable instructions are transmission media. Thus, by way of example, and not limitation, embodiments of the disclosure can comprise at least two distinctly different kinds of computer-readable media: non-transitory computer-readable storage media (devices) and transmission media.

Non-transitory computer-readable storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry desired program code means in the form of computer-executable instructions or data structures and which can be accessed by a general purpose or special purpose computer. Combinations of the above should also be included within the scope of computer-readable media.

Further, upon reaching various computer system components, program code means in the form of computer-executable instructions or data structures can be transferred automatically from transmission media to non-transitory computer-readable storage media (devices) (or vice versa). For example, computer-executable instructions or data structures received over a network or data link can be buffered in RAM within a network interface module (e.g., a "NIC"), and then eventually transferred to computer system RAM and/or to less volatile computer storage media (devices) at a computer system. Thus, it should be understood that non-transitory computer-readable storage media (devices) can be included in computer system components that also (or even primarily) utilize transmission media.

Computer-executable instructions comprise, for example, instructions and data which, when executed at a processor, cause a general-purpose computer, special purpose computer, or special purpose processing device to perform a certain function or group of functions. In some embodiments, computer-executable instructions are executed on a general-purpose computer to turn the general-purpose computer into a special purpose computer implementing elements of the disclosure. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the disclosure may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, tablets, pagers, routers, switches, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Embodiments of the present disclosure can also be implemented in cloud computing environments. In this description, "cloud computing" is defined as a model for enabling on-demand network access to a shared pool of configurable computing resources. For example, cloud computing can be employed in the marketplace to offer ubiquitous and convenient on-demand access to the shared pool of configurable computing resources. The shared pool of configurable computing resources can be rapidly provisioned via virtualization and released with low management effort or service provider interaction, and then scaled accordingly.

A cloud-computing model can be composed of various characteristics such as, for example, on-demand self-service, broad network access, resource pooling, rapid elasticity, measured service, and so forth. A cloud-computing model can also expose various service models, such as, for example, Software as a Service ("SaaS"), Platform as a Service ("PaaS"), and Infrastructure as a Service ("IaaS"). A cloud-computing model can also be deployed using different deployment models such as private cloud, community cloud, public cloud, hybrid cloud, and so forth. In this description and in the claims, a "cloud-computing environment" is an environment in which cloud computing is employed.

Figure 10:
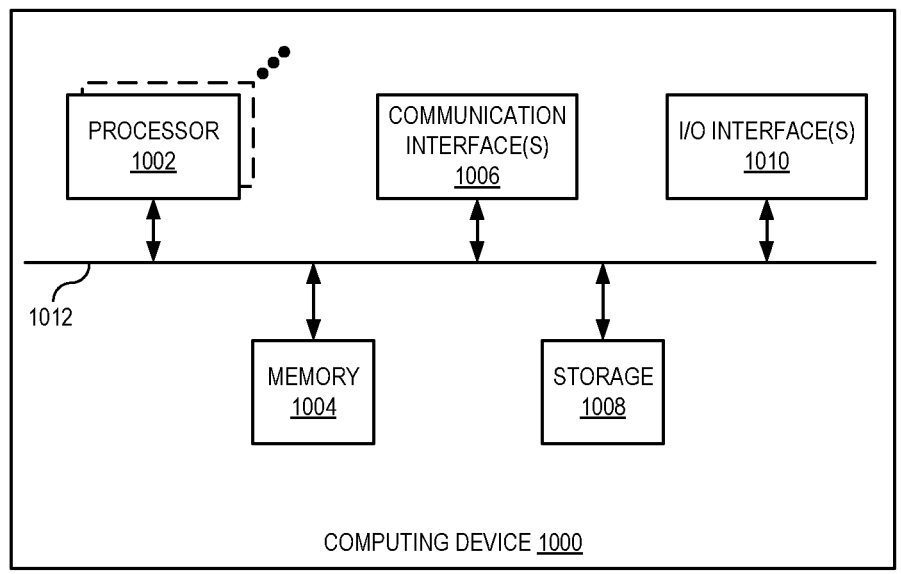
FIG. 10 illustrates a block diagram of an exemplary computing device in accordance with one or more embodiments.

FIG. 10 illustrates, in block diagram form, an exemplary computing device 1000 that may be configured to perform one or more of the processes described above. One will appreciate that one or more computing devices such as the computing device 1000 may implement the audio signal processing system 700. As shown by FIG. 10, the computing device can comprise a processor 1002, memory 1004, one or more communication interfaces 1006, a storage device 1008, and one or more I/O devices/interfaces 1010. In certain embodiments, the computing device 1000 can include fewer or more components than those shown in FIG. 10. Components of computing device 1000 shown in FIG. 10 will now be described in additional detail.

In particular embodiments, processor(s) 1002 includes hardware for executing instructions, such as those making up a computer program. As an example, and not by way of limitation, to execute instructions, processor(s) 1002 may retrieve (or fetch) the instructions from an internal register, an internal cache, memory 1004, or a storage device 1008 and decode and execute them. In various embodiments, the processor(s) 1002 may include one or more central processing units (CPUs), graphics processing units (GPUs), field programmable gate arrays (FPGAs), systems on chip (SoC), or other processor(s) or combinations of processors.

The computing device 1000 includes memory 1004, which is coupled to the processor(s) 1002. The memory 1004 may be used for storing data, metadata, and programs for execution by the processor(s). The memory 1004 may include one or more of volatile and non-volatile memories, such as Random Access Memory ("RAM"), Read Only Memory ("ROM"), a solid state disk ("SSD"), Flash, Phase Change Memory ("PCM"), or other types of data storage. The memory 1004 may be internal or distributed memory.

The computing device 1000 can further include one or more communication interfaces 1006. A communication interface 1006 can include hardware, software, or both. The communication interface 1006 can provide one or more interfaces for communication (such as, for example, packet-based communication) between the computing device and one or more other computing devices 1000 or one or more networks. As an example, and not by way of limitation, communication interface 1006 may include a network interface controller (NIC) or network adapter for communicating with an Ethernet or other wire-based network or a wireless NIC (WNIC) or wireless adapter for communicating with a wireless network, such as a WI-FI. The computing device 1000 can further include a bus 1012. The bus 1012 can comprise hardware, software, or both that couples components of computing device 1000 to each other.

The computing device 1000 includes a storage device 1008 includes storage for storing data or instructions. As an example, and not by way of limitation, storage device 1008 can comprise a non-transitory storage medium described above. The storage device 1008 may include a hard disk drive (HDD), flash memory, a Universal Serial Bus (USB) drive or a combination these or other storage devices. The computing device 1000 also includes one or more input or output ("I/O") devices/interfaces 1010, which are provided to allow a user to provide input to (such as user strokes), receive output from, and otherwise transfer data to and from the computing device 1000. These I/O devices/interfaces 1010 may include a mouse, keypad or a keyboard, a touch screen, camera, optical scanner, network interface, modem, other known I/O devices or a combination of such I/O devices/interfaces 1010. The touch screen may be activated with a stylus or a finger.

The I/O devices/interfaces 1010 may include one or more devices for presenting output to a user, including, but not limited to, a graphics engine, a display (e.g., a display screen), one or more output drivers (e.g., display drivers), one or more audio speakers, and one or more audio drivers. In certain embodiments, I/O devices/interfaces 1010 is configured to provide graphical data to a display for presentation to a user. The graphical data may be representative of one or more graphical user interfaces and/or any other graphical content as may serve a particular implementation.

In the foregoing specification, embodiments have been described with reference to specific exemplary embodiments thereof. Various embodiments are described with reference to details discussed herein, and the accompanying drawings illustrate the various embodiments. The description above and drawings are illustrative of one or more embodiments and are not to be construed as limiting. Numerous specific details are described to provide a thorough understanding of various embodiments.

Embodiments may include other specific forms without departing from its spirit or essential characteristics. The described embodiments are to be considered in all respects only as illustrative and not restrictive. For example, the methods described herein may be performed with less or more steps/acts or the steps/acts may be performed in differing orders. Additionally, the steps/acts described herein may be repeated or performed in parallel with one another or in parallel with different instances of the same or similar steps/acts. The scope of the invention is, therefore, indicated by the appended claims rather than by the foregoing description. All changes that come within the meaning and range of equivalency of the claims are to be embraced within their scope.

In the various embodiments described above, unless specifically noted otherwise, disjunctive language such as the phrase "at least one of A, B, or C," is intended to be understood to mean either A, B, or C, or any combination thereof (e.g., A, B, and/or C). As such, disjunctive language is not intended to, nor should it be understood to, imply that a given embodiment requires at least one of A, at least one of B, or at least one of C to each be present.

We claim:

1. A computer-implemented method comprising:
receiving an input including an unprocessed audio sequence and a request to perform an audio signal processing effect on the unprocessed audio sequence;
analyzing, by a deep encoder, the unprocessed audio sequence to determine parameters for processing the unprocessed audio sequence, the parameters associated with the requested audio signal processing effect;
sending the unprocessed audio sequence and the parameters to one or more audio signal processing effects plugins to perform the audio signal processing effect using the parameters; and
outputting a processed audio sequence after processing of the unprocessed audio sequence using the parameters of the one or more audio signal processing effects plugins.

2. The computer-implemented method of claim 1, wherein the deep encoder is trained using a training system configured to:
obtain training audio data, the training audio data including at least one training audio file and an associated ground truth audio file corresponding to the audio signal processing effect;
configure the deep encoder for the audio signal processing effect by serially adding each audio signal processing effects plugin of the one or more audio signal processing effects plugins to the deep encoder;
analyze, by the deep encoder, the training audio data to estimate values of training parameters for processing the training audio file;
provide the estimated values of the training parameters and the training audio file to the one or more audio signal processing effects plugins which generate a training output;
calculate, using a loss function, a loss of the training output and the ground truth audio file; and
train the deep encoder based on the loss.

3. The computer-implemented method of claim 2, wherein calculating, using the loss function, the loss of the training output of the one or more audio signal processing effects plugins and the ground truth audio file further comprises:
determining a number of audio frames representing a delay between the ground truth audio file and the training output;
removing the number of audio frames representing the delay;
aligning the ground truth audio file and the training output;
calculating a polarity;
calculating a first loss value with a non-inverted polarity and a second loss value with an inverted polarity; and
selecting a minimum of the first loss value and the second loss value as the loss.

4. The computer-implemented method of claim 2, further comprising:
for each frame of each training audio file in the training audio data:
analyzing, by the deep encoder, a first frame of the training audio file having a first frame length; and
generating a second frame of the training audio file from the first frame, the second frame having a second frame length, wherein the second frame length is shorter than the first frame length.

5. The computer-implemented method of claim 4, further comprising:
for each training audio file in the training audio data:
instantiating a first audio signal processing effects plugin to generate output audio frames based on the second frame and the estimated values of the training parameters; and
instantiating a second audio signal processing effects plugin and a third audio signal processing effects plugin to determine gradients of the estimated values of the training parameters based on the second frame and the estimated values of the training parameters, wherein a same state is maintained for each of the first audio signal processing effects plugin, the second audio signal processing effects plugin, and the third audio signal processing effects plugin.

6. The computer-implemented method of claim 5, further comprising:
backpropagating the determined gradients of the estimated values of the training parameters to the deep encoder and the one or more audio signal processing effects plugins.

7. The computer-implemented method of claim 6, wherein determining the gradients of the estimated values of the training parameters comprises:
approximating the gradients of the estimated values of the training parameters using a simultaneous perturbation stochastic approximation method.

8. The computer-implemented method of claim 1, wherein the audio signal processing effect is a tube amplifier emulation audio processing effect, wherein the one or more audio signal processing effects plugins include a multiband dynamic range compressor, and wherein the parameters include a threshold, makeup gain, ratio, and knee for each frequency band, frequency splits, an input gain, and an output gain.

9. The computer-implemented method of claim 1, wherein the audio signal processing effect is an automatic non-speech vocal sounds removal audio processing effect, wherein the one or more audio signal processing effects plugins include multiband noise gate, and wherein the parameters include a threshold, reduction gain, and ratio for each frequency band, frequency splits, an input gain, and an output gain.

10. The computer-implemented method of claim 1, wherein the audio signal processing effect is a music mastering audio processing effect, and wherein the one or more audio signal processing effects plugins include a multiband dynamic range compressor, a graphic equalizer, and a mono limiter, and wherein the parameters include a threshold, makeup gain and ratio for each frequency band, frequency splits, and an input gain for the multiband dynamic range compressor, a gain for each frequency band and an output gain for the graphic equalizer, and a threshold for the mono limiter.

11. A non-transitory computer-readable storage medium including instructions stored thereon which, when executed by at least one processor, cause the at least one processor to:
receive an input including an unprocessed audio sequence and a request to perform an audio signal processing effect on the unprocessed audio sequence;
analyze, by a deep encoder, the unprocessed audio sequence to determine parameters for processing the unprocessed audio sequence, the parameters associated with the requested audio signal processing effect;
send the unprocessed audio sequence and the parameters to one or more audio signal processing effects plugins to perform the audio signal processing effect using the parameters; and output a processed audio sequence after processing of the unprocessed audio sequence using the parameters of the one or more audio signal processing effects plugins.

12. The non-transitory computer-readable storage medium of claim 11, further comprising instructions to train the deep encoder by a training system, the training system configured to:
   obtain training audio data, the training audio data including at least one training audio file and an associated ground truth audio file corresponding to the audio signal processing effect;
   configure the deep encoder for the audio signal processing effect by serially adding each audio signal processing effects plugin of the one or more audio signal processing effects plugins to the deep encoder;
   analyze, by the deep encoder, the training audio data to estimate values of training parameters for processing the training audio data;
   provide the estimated values of the training parameters and the training audio data to the one or more audio signal processing effects plugins which generate a training output;
   calculate, using a loss function, a loss of the training output and the ground truth audio file; and
   train the deep encoder based on the loss.

13. The non-transitory computer-readable storage medium of claim 12, wherein to calculate, using the loss function, the loss of the training output of the one or more audio signal processing effects plugins and the ground truth audio file, the instructions, when executed, further cause the at least one processor to:
   determine a number of audio frames representing a delay between the ground truth audio file and the training output;
   remove the number of audio frames representing the delay;
   align the ground truth audio file and the training output;
   calculate a polarity;
   calculate a first loss value with a non-inverted polarity and a second loss value with an inverted polarity; and
   select a minimum of the first loss value and the second loss value as the loss.

14. The non-transitory computer-readable storage medium of claim 12, wherein the instructions, when executed, further cause the at least one processor to:
   for each frame of each training audio file in the training audio data:
      analyze, by the deep encoder, a first frame of the training audio file having a first frame length, and
      generate a second frame of the training audio file from the first frame, the second frame having a second frame length, wherein the second frame length is shorter than the first frame length.

15. The non-transitory computer-readable storage medium of claim 14, wherein the instructions, when executed, further cause the at least one processor to:
   for each training audio file in the training audio data:
      instantiate a first audio signal processing effects plugin to generate output audio frames based on the second frame and the estimated values of the training parameters, and
      instantiate a second audio signal processing effects plugin and a third audio signal processing effects plugin to determine gradients of the estimated values of the training parameters based on the second frame and the estimated values of the training parameters, wherein a same state is maintained for each of the first audio signal processing effects plugin, the second audio signal processing effects plugin, and the third audio signal processing effects plugin.

16. The non-transitory computer-readable storage medium of claim 15, wherein the instructions, when executed, further cause the at least one processor to:
   backpropagate the determined gradients of the estimated values of the training parameters to the deep encoder and the one or more audio signal processing effects plugins.

17. A system comprising:
   one or more electronic devices including at least one processor and memory, the one or more electronic devices implementing an audio signal processing system including instructions which, when executed by the at least one processor, cause the audio signal processing system to:
      receive an input including an unprocessed audio sequence and a request to perform an audio signal processing effect on the unprocessed audio sequence;
      analyze, by a deep encoder, the unprocessed audio sequence to determine parameters for processing the unprocessed audio sequence, the parameters associated with the requested audio signal processing effect;
      send the unprocessed audio sequence and the parameters to one or more audio signal processing effects plugins to perform the audio signal processing effect using the parameters; and
      output a processed audio sequence after processing of the unprocessed audio sequence using the parameters of the one or more audio signal processing effects plugins.

18. The system of claim 17, further comprising a second one or more electronic devices including at least one second processor and second memory, the second one or more electronic devices implementing a training system including second instructions which, when executed by the at least one second processor, cause the training system to:
   obtain training audio data, the training audio data including at least one training audio file and an associated ground truth audio file corresponding to the audio signal processing effect;
   configure the deep encoder for the audio signal processing effect by serially adding each audio signal processing effects plugin of the one or more audio signal processing effects plugins to the deep encoder;
   analyze, by the deep encoder, the training audio data to estimate values of training parameters for processing the training audio data;
   provide the estimated values of the training parameters and the training audio data to the one or more audio signal processing effects plugins which generate a training output;
   calculate, using a loss function, a loss of the training output and the ground truth audio file; and
   train the deep encoder based on the loss.

19. The system of claim 18, wherein to calculate, using the loss function, the loss of the training output of the one or more audio signal processing effects plugins and the ground truth audio file, the second instructions, when executed, further cause the training system to:
   determining a number of audio frames representing a delay between the ground truth audio file and the training output;
   removing the number of audio frames representing the delay;
   aligning the ground truth audio file and the training output;

calculating a polarity;
calculating a first loss value with a non-inverted polarity and a second loss value with an inverted polarity; and
selecting a minimum of the first loss value and the second loss value as the loss.

20. The system of claim 18, wherein the second instructions, when executed, further cause the training system to:
for each frame of each training audio file in the training audio data:
analyze, by the deep encoder, a first frame of the training audio file having a first frame length, and
generate a second frame of the training audio file from the first frame, the second frame having a second frame length, wherein the second frame length is shorter than the first frame length.

* * * * *